United States Patent
Yamazaki et al.

(10) Patent No.: US 10,062,742 B2
(45) Date of Patent: Aug. 28, 2018

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masahiko Hayakawa, Atsugi (JP); Yoshifumi Tanada, Atsugi (JP); Mitsuaki Osame, Atsugi (JP); Aya Anzai, Tsukui (JP); Ryota Fukumoto, Obu (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/845,459

(22) Filed: Dec. 18, 2017

(65) Prior Publication Data

US 2018/0122884 A1 May 3, 2018

Related U.S. Application Data

(63) Continuation of application No. 15/074,255, filed on Mar. 18, 2016, now Pat. No. 9,859,353, which is a (Continued)

(30) Foreign Application Priority Data

Jun. 5, 2002 (JP) .................. 2002-164970
Aug. 6, 2002 (JP) .................. 2002-228987

(51) Int. Cl.
*H01L 27/32* (2006.01)
*H01L 27/12* (2006.01)
(Continued)

(52) U.S. Cl.
CPC ....... *H01L 27/3262* (2013.01); *G09G 3/3233* (2013.01); *H01L 27/0248* (2013.01);
(Continued)

(58) Field of Classification Search
CPC ............ H01L 27/3262; H01L 27/3265; H01L 27/3248; H01L 27/3276; H01L 27/12;
(Continued)

(56) References Cited

U.S. PATENT DOCUMENTS 4,005,471 A  1/1977 Magdo et al.
4,404,578 A  9/1983 Takafuji et al.
(Continued)

FOREIGN PATENT DOCUMENTS

EP  0942407 A  9/1999
EP  1063630 A  12/2000
(Continued)

*Primary Examiner* — Dao H Nguyen
(74) *Attorney, Agent, or Firm* — Robinson Intellectual Property Law Office; Eric J. Robinson

(57) ABSTRACT

Semiconductor elements deteriorate or are destroyed due to electrostatic discharge damage. The present invention provides a semiconductor device in which a protecting means is formed in each pixel. The protecting means is provided with one or a plurality of elements selected from the group consisting of resistor elements, capacitor elements, and rectifying elements. Sudden changes in the electric potential of a source electrode or a drain electrode of a transistor due to electric charge that builds up in a pixel electrode is relieved by disposing the protecting means between the pixel electrode of the light-emitting element and the source electrode or the drain electrode of the transistor. Deterioration or destruction of the semiconductor element due to electrostatic discharge damage is thus prevented.

20 Claims, 24 Drawing Sheets

Related U.S. Application Data continuation of application No. 14/618,261, filed on Feb. 10, 2015, now Pat. No. 9,293,477, which is a continuation of application No. 14/143,652, filed on Dec. 30, 2013, now Pat. No. 8,975,632, which is a continuation of application No. 13/223,582, filed on Sep. 1, 2011, now Pat. No. 8,624,258, which is a continuation of application No. 12/506,465, filed on Jul. 21, 2009, now Pat. No. 8,188,945, which is a continuation of application No. 10/453,940, filed on Jun. 4, 2003, now Pat. No. 7,592,980.

(51) Int. Cl.
| | |
|---|---|
| H01L 29/04 | (2006.01) |
| G09G 3/10 | (2006.01) |
| H01L 27/02 | (2006.01) |
| H01L 29/786 | (2006.01) |
| G09G 3/3233 | (2016.01) |

(52) U.S. Cl.
CPC .......... *H01L 27/12* (2013.01); *H01L 27/1222* (2013.01); *H01L 27/3248* (2013.01); *H01L 27/3265* (2013.01); *H01L 27/3276* (2013.01); *H01L 29/78675* (2013.01); *G09G 2310/0251* (2013.01); *G09G 2330/04* (2013.01); *H01L 27/1214* (2013.01)

(58) Field of Classification Search
CPC ............. H01L 27/1214; H01L 27/1222; H01L 27/0248; H01L 29/76875; G09G 3/3233
USPC .......... 257/40, 66, 71, 72, 79, 658, E27.111, 257/E27.131, E27.152, E29.113, E29.29, 257/E29.293, E21.05, E21.052, E21.006, 257/E21.358, E51.003, E51.008; 438/22, 438/29, 30, 99, 158; 315/169.1, 169.3
See application file for complete search history.

(56) References Cited

U.S. PATENT DOCUMENTS

| | | | |
|---|---|---|---|
| 5,684,365 A | 11/1997 | Tang et al. | |
| 5,714,968 A | 2/1998 | Ikeda | |
| 5,729,308 A | 3/1998 | Yamazaki et al. | |
| 5,929,464 A | 7/1999 | Yamazaki et al. | |
| 6,049,228 A | 4/2000 | Moon | |
| 6,084,579 A | 7/2000 | Hirano | |
| 6,104,041 A | 8/2000 | Hsueh et al. | |
| 6,113,450 A | 9/2000 | Narayanan et al. | |
| 6,185,274 B1 | 2/2001 | Kinno et al. | |
| 6,215,244 B1 | 4/2001 | Kuribayashi et al. | |
| 6,281,520 B1 | 8/2001 | Yamazaki | |
| 6,323,490 B1 | 11/2001 | Ikeda et al. | |
| 6,380,687 B1 | 4/2002 | Yamazaki | |
| 6,452,341 B1 | 9/2002 | Yamauchi et al. | |
| 6,472,256 B1 | 10/2002 | Zhang et al. | |
| 6,529,178 B1 | 3/2003 | Kimura | |
| 6,593,691 B2 | 7/2003 | Nishi et al. | |
| 6,636,520 B1 | 10/2003 | Jason et al. | |
| 6,737,708 B2 | 5/2004 | Zhang et al. | |
| 6,774,574 B1 | 8/2004 | Koyama | |
| 6,777,887 B2 | 8/2004 | Koyama | |
| 6,859,193 B1 | 2/2005 | Yumoto | |
| 6,860,780 B2 | 3/2005 | Miyashita et al. | |
| 6,879,110 B2 | 4/2005 | Koyama | |
| 6,900,785 B2 | 5/2005 | Kimura | |
| 6,909,240 B2 | 6/2005 | Osame et al. | |
| 6,909,242 B2 | 6/2005 | Kimura | |
| 6,984,159 B1 | 1/2006 | Kado et al. | |
| 7,053,890 B2 * | 5/2006 | Inukai | G09G 3/3266 257/E27.111 |
| 7,067,845 B2 | 6/2006 | Murakami et al. | |
| 7,105,365 B2 | 9/2006 | Hiroki et al. | |
| 7,121,642 B2 | 10/2006 | Stoessel et al. | |
| 7,158,104 B2 | 1/2007 | Koyama | |
| 7,190,335 B2 | 3/2007 | Yamazaki et al. | |
| 7,193,591 B2 * | 3/2007 | Yumoto | G09G 3/3241 315/169.3 |
| 7,195,499 B2 * | 3/2007 | Yamazaki | G09G 3/006 257/E51.001 |
| 7,230,591 B2 * | 6/2007 | Inukai | G09G 3/2011 345/36 |
| 7,247,995 B2 | 7/2007 | Osame et al. | |
| 7,262,556 B2 | 8/2007 | Osame et al. | |
| 7,268,760 B2 | 9/2007 | Mikami et al. | |
| 7,358,531 B2 | 4/2008 | Koyama | |
| 7,379,039 B2 | 5/2008 | Yumoto | |
| 7,388,564 B2 | 6/2008 | Yumoto | |
| 7,402,945 B2 | 7/2008 | Yamazaki et al. | |
| 7,525,165 B2 | 4/2009 | Yamazaki et al. | |
| 7,592,980 B2 | 9/2009 | Yamazaki et al. | |
| 7,629,018 B2 | 12/2009 | Yamazaki et al. | |
| 7,723,721 B2 | 5/2010 | Udagawa et al. | |
| 7,825,419 B2 | 11/2010 | Yamagata et al. | |
| 8,723,760 B2 | 5/2014 | Osame et al. | |
| 8,968,822 B2 | 3/2015 | Yamazaki et al. | |
| 8,975,632 B2 | 3/2015 | Yamazaki et al. | |
| 9,293,477 B2 | 3/2016 | Yamazaki et al. | |
| 2002/0044140 A1 | 4/2002 | Inukai | |
| 2002/0068372 A1 | 6/2002 | Kunii | |
| 2002/0153844 A1 | 10/2002 | Koyama | |
| 2004/0003939 A1 | 1/2004 | Nishi et al. | |
| 2004/0012550 A1 | 1/2004 | Koyama | |
| 2005/0231123 A1 | 10/2005 | Kimura | |
| 2006/0286889 A1 | 12/2006 | Nishi et al. | |
| 2013/0248892 A1 | 9/2013 | Osame et al. | |
| 2015/0243922 A1 | 8/2015 | Yamazaki et al. | |

FOREIGN PATENT DOCUMENTS

| | | |
|---|---|---|
| EP | 1109225 A | 6/2001 |
| EP | 1130565 A | 9/2001 |
| EP | 1178462 A | 2/2002 |
| JP | 56-026468 A | 3/1981 |
| JP | 62-092370 A | 4/1987 |
| JP | 06-250219 A | 9/1994 |
| JP | 2001-005426 A | 1/2001 |
| JP | 2001-133807 A | 5/2001 |
| JP | 2001-236027 A | 8/2001 |
| JP | 2001-319877 A | 11/2001 |
| JP | 2002-057162 A | 2/2002 |
| JP | 2002-082651 A | 3/2002 |
| JP | 3281848 | 5/2002 |
| WO | WO-1998/036405 | 8/1998 |
| WO | WO-2001/006484 | 1/2001 |

\* cited by examiner

PIXEL

FIG. 4A
FIG. 4B
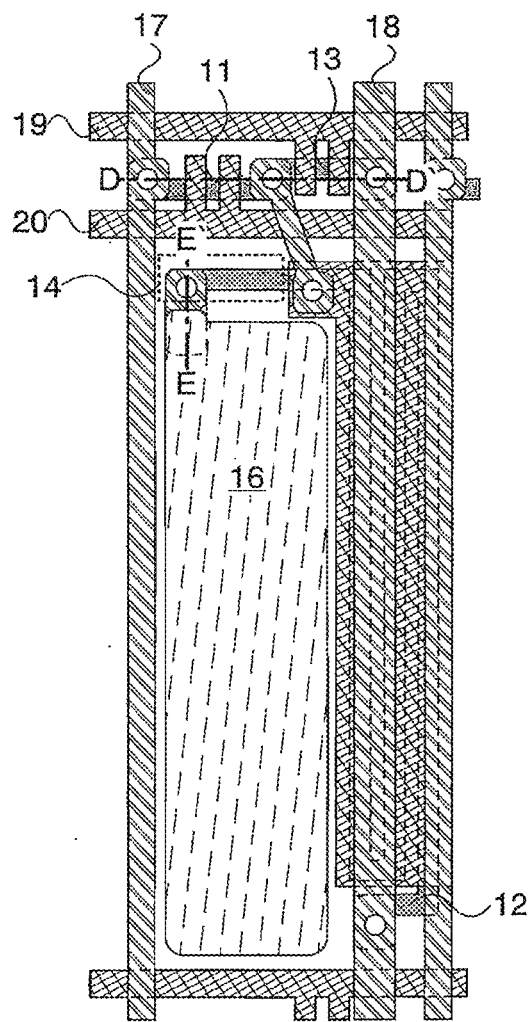
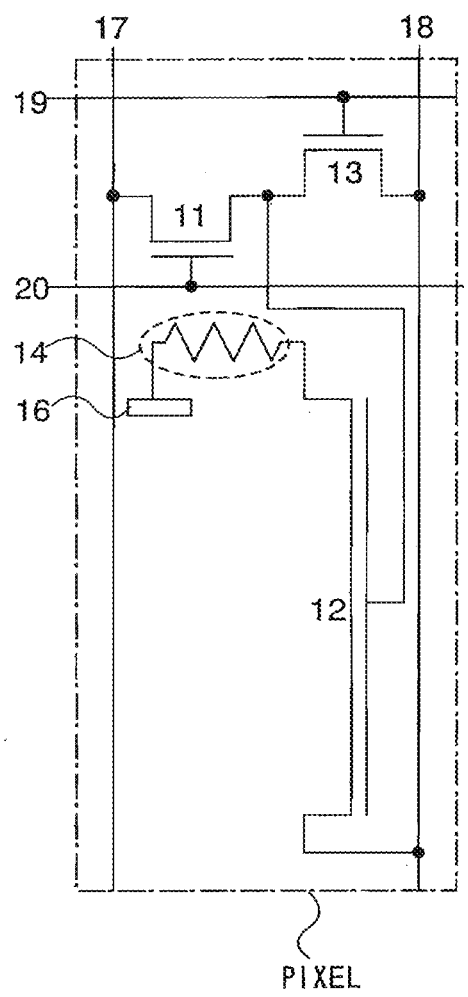
PIXEL

SEMICONDUCTOR DEVICE

BACKGROUND OF THE INVENTION

1. Field of the Invention

The present invention resides in a technical field relating to semiconductor devices. In particular, the present invention resides in a technical field relating to semiconductor devices that use a semiconductor element such as a transistor.

2. Description of the Related Art

Development of semiconductor devices having light-emitting elements has been advanced in recent years. In addition to the existing advantages of liquid crystal display devices, the semiconductor devices also have characteristics such as fast response speed, superior dynamic display, and a wide angle of view. The semiconductor devices are attracting attention as flat panel displays for the next generation of mobile devices, which will be capable of utilizing dynamic contents.

A semiconductor device having light-emitting elements has a plurality of pixels, which each have a light-emitting element and at least two transistors. The transistor that is connected in series with the light-emitting element in the pixel (hereinafter written as a driving transistor) plays a role in controlling light emitted from the light-emitting element. The light-emitting element has a structure having a first electrode, a second electrode, and a light-emitting layer sandwiched between the first electrode and the second electrode. One electrode connected to a source electrode or a drain electrode of the driving TFT is referred to as a pixel electrode, and the other electrode is referred to as an opposing electrode.

Static electricity builds up, developing due to friction, contact, and the like with air and objects such as conductors, semiconductors, and insulators. Electrostatic discharge occurs if an object is strongly charged. If this phenomenon develops in a free node such as an input terminal of the semiconductor device, then minute semiconductor elements manufactured on a substrate will degrade or be destroyed. This is referred to as electrostatic discharge damage.

In order to prevent electrostatic discharge damage, a circuit formed on a substrate (hereinafter written as an internal circuit 64) is connected to an externally attached IC (hereinafter written as an external circuit 61) through a protecting means (also referred to as a protection circuit) 63 and an FPC 62 as shown in FIG. 15. The protecting means 63 detects a voltage and a current supplied from the external circuit 61 to the internal circuit 64, and controls the values of the voltage and the current in order to prevent damage to the internal circuit 64 during abnormal operation.

When manufacturing a semiconductor device having a light-emitting element, TFTS are first manufactured over a substrate, and light-emitting elements are manufactured thereafter. More specifically, Ts are first manufactured over a substrate, and then wirings are manufactured so as to be electrically connected to source regions and drain regions of the TFTs. Pixel electrodes of the light-emitting elements are then manufactured so as to be electrically connected to the wirings. The pixel electrodes are in an exposed state when manufactured up to this point, and therefore static electricity tends to build up in the pixel electrodes. In particular, the pixel electrodes become antennas during manufacturing processes involving charged particles, such as dry etching and electron beam evaporation, and electrostatic discharge is easily induced. Sudden discharge of electric charge that has built up in the pixel electrodes leads to degradation or destruction of the semiconductor elements connected to the pixel electrodes.

SUMMARY OF THE INVENTION

In light of the above-mentioned circumstances, an object of the present invention is to provide a semiconductor device having a light-emitting element, in which electrostatic discharge damage during manufacturing processes thereof is prevented. More specifically, an object of the present invention is to provide a semiconductor device in which electrostatic discharge damage is prevented in a state up through the manufacture of pixel electrodes.

In order to resolve the above-mentioned problems, the present invention provides a semiconductor device in which a protecting means is formed in each pixel. The protecting means is provided with one or a plurality of elements selected from resistor elements, capacitor elements, and rectifying elements. Further, the present invention provides a semiconductor device in which the protecting means is disposed between a pixel electrode of a light-emitting element and a source electrode or a drain electrode of a transistor. Note that the aforementioned rectifying elements are, for example, elements having a rectifying action, and correspond to diodes, transistors of which a drain electrode and a gate electrode are connected, and the like. That is, an essential structure of the present invention is one in which the protecting means is formed in each pixel, and the protecting means is disposed between the pixel electrode of the light-emitting element, and the source electrode or the drain electrode of the transistor. The source electrode or the drain electrode of the transistor is connected to the pixel electrode for cases in which the protecting means is assumed not to be disposed.

If the protecting means is a resistor element, sudden changes in the electric potential of the source electrode or the drain electrode of the transistor are relieved by disposing the resistor element between the pixel electrode and the source electrode or the drain electrode of the transistor so that electric charge that builds up in the pixel electrode is not supplied all at once and directly to the transistor.

If the protecting means is a capacitor element, sudden changes in the electric potential of the source electrode or the drain electrode of the transistor are relieved by accumulating or discharging the electric charge contained in the capacitor element, and distributing the electric charge among the capacitor element and the transistor.

If the protecting means is a transistor of which the drain electrode and the gate electrode are connected, a source electrode of the transistor is connected to an electric power source line. The transistor discharges the electric charge that builds up in the pixel electrode to the electric power source line, and the electric potential of the pixel electrode is thus set to the same electric potential as that of the electric power source line, or to an electric potential conforming thereto. Sudden changes in the electric potential of the source electrode or the drain electrode of the transistor caused by the electric charge that builds up in the pixel electrode can thus be relieved.

If the protecting means is a diode, one electrode of the diode is connected to the pixel electrode, and the other electrode is connected to the electric power source line. The electric potential of the pixel electrode is set to the same electric potential as that of the electric power source line by discharging the electric charge that builds up in the pixel electrode to the electric power source line. Sudden changes in the electric potential of the source electrode or the drain electrode of the transistor caused by the electric charge that builds up in the pixel electrode can thus be relieved.

With the structure described above, the present invention relieves sudden changes in the electric potential of the source electrode or the drain electrode of the transistor due to electric charge that builds up in the pixel electrode, and prevents electrostatic discharge damage. Further, the present invention prevents electrostatic discharge damage during manufacturing processes, and in particular, electrostatic discharge damage in a state up through the manufacture of the pixel electrode.

BRIEF DESCRIPTION OF THE DRAWINGS

In the accompanying drawings:

FIGS. 4A and 4B are top views and a circuit diagram, respectively, of a semiconductor device of the present invention;

DETAILED DESCRIPTION OF THE PREFERRED EMBODIMENTS

Embodiment Mode 1

Figure 1A:
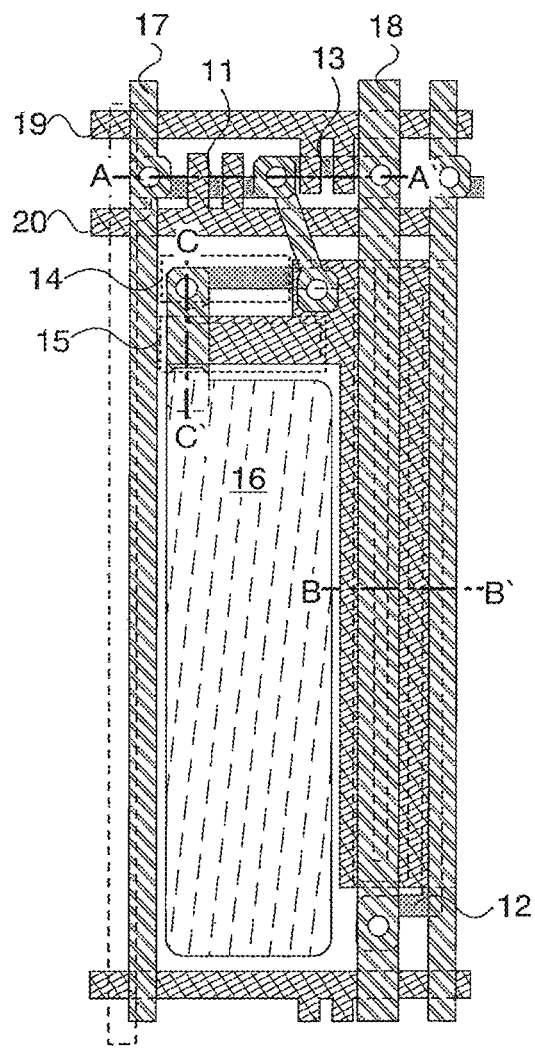
FIGS. 1A and 1B are top views and a circuit diagram, respectively, of a semiconductor device of the present invention.
Figure 1B:
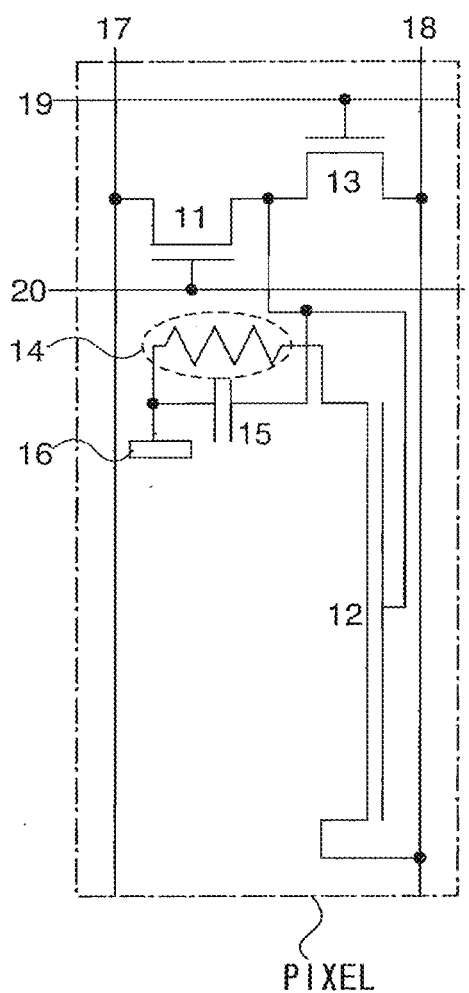
Figure 2A:
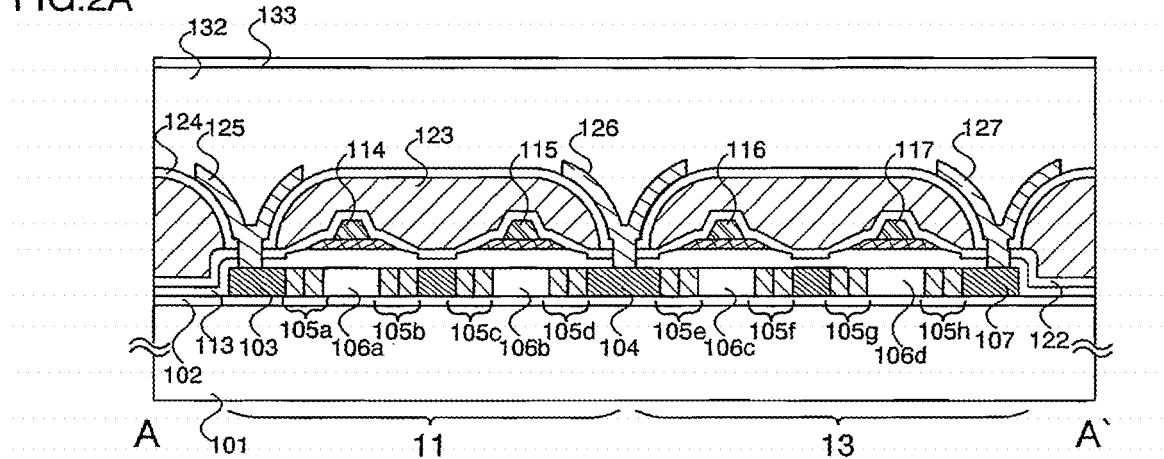
FIGS. 2A to 2C are cross sectional diagrams of a semiconductor device of the present invention.
Figure 2B:
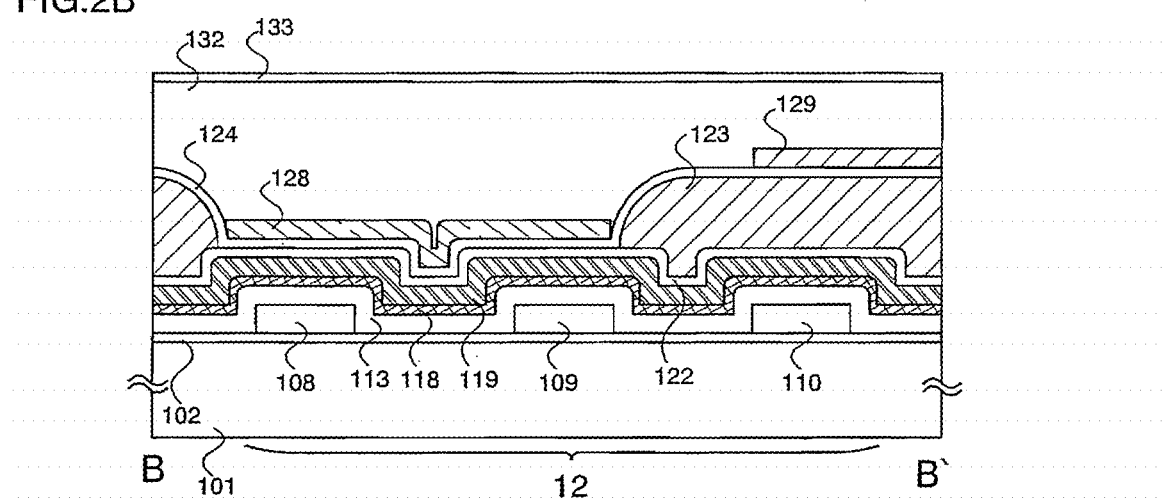
Figure 2C:
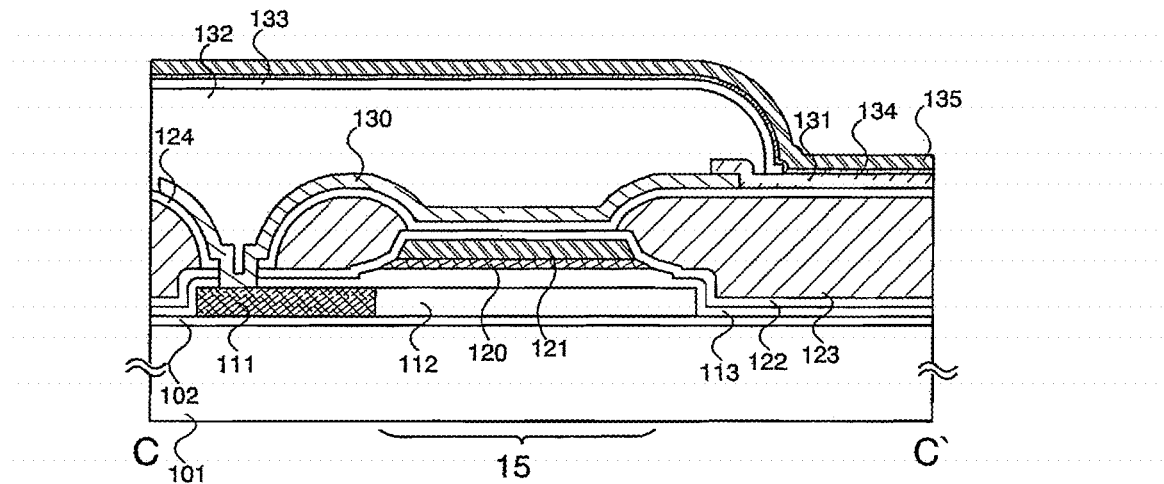
Figure 3:
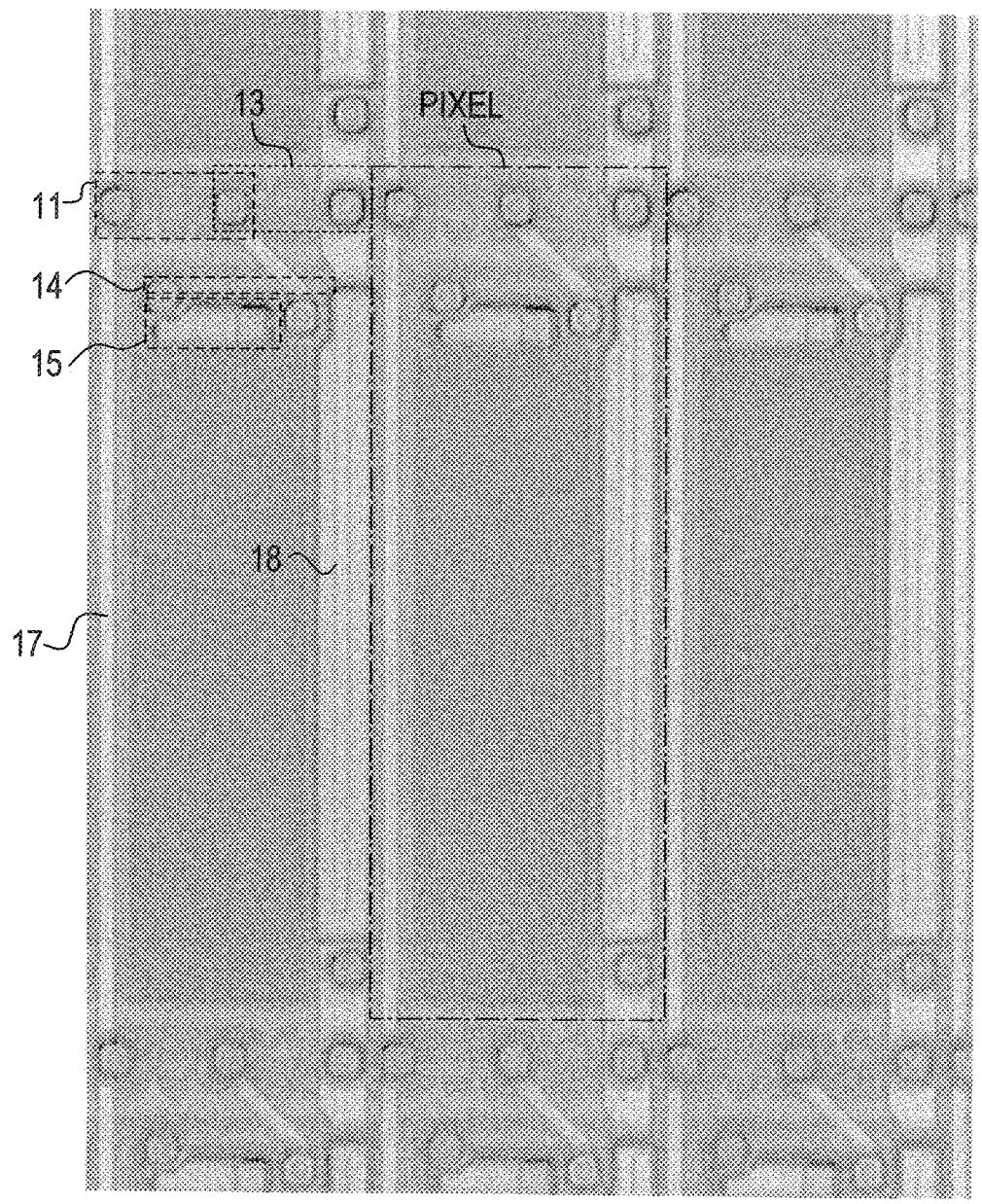
FIG. 3 is a photograph of a top view of a pixel provided in a semiconductor device of the present invention.

An embodiment mode of the present invention is explained using FIGS. 1A to 3. FIGS. 1A and 1B show a state up through the manufacture of a pixel electrode. FIG. 1A is a schematic diagram of a top view (masking diagram) of a pixel of a semiconductor device, and FIG. 1B is a circuit diagram that schematically expresses a circuit structure thereof. FIGS. 2A to 2C are cross sectional diagrams of the pixels of FIG. 1A. FIG. 3 is a photograph of a panel having an actually manufactured pixel, magnified to approximately 635 times with an optical microscope.

Each of the pixels shown in FIGS. 1A and 1B are disposed in a region surrounded by a signal line 17 and an electric power source line 18 arranged in a column direction, and a scanning line 20 and a reset line 19 arranged in a row direction. Further, each of the pixels has a switching transistor 11 (hereinafter written as the transistor 11), a driving transistor 12 (hereinafter written as the transistor 12), an erasing transistor 13 (hereinafter written as the transistor 13), a resistor element 14, a capacitor element 15, and a pixel electrode 16. The resistor element 14 and the capacitor element 15 correspond to a protecting means 21.

The fact that the resistor element 14 and the capacitor element 15, which are the protecting means 21, are disposed can be given as a characteristic of each of the pixels shown in FIGS. 1A and 1B. The resistor element 14 relieves sudden changes in the electric potential of the transistor 12 caused by excess electric charge that builds up in the pixel electrode 16. More specifically, sudden changes in the electric potential of a source electrode or a drain electrode of the transistor 12 can be relieved by disposing the resistor element 14 between the pixel electrode 16 and the transistor 12 so that the excess electric charge that builds up in the pixel electrode 16 is not supplied all at once and directly to the transistor 12.

In this embodiment mode, the resistor element 14 is formed by a semiconductor, and has a resistance value of several tens of kΩ. Specifically, it has a resistance value of 20 kΩ to 200 kΩ. However, the present invention is not limited to this, and a metal or the like for forming a gate electrode or a wiring may also be used as a material for forming the resistor element 14. Further, there are also no specific limitations placed on the shape of the resistor element 14 disposed within the pixel, and the shape can be arbitrarily set. In addition, there are also no specific limitations of the resistance value of the resistor element 14, and the constituent material and its shape may be arbitrarily set so that a desired resistance value can be obtained.

Similarly, the capacitor element 15 relieves sudden changes in the electric potential of the transistor 12 caused by the excess electric charge that builds up in the pixel electrode 16. More specifically, the capacitor element 15 accumulates or discharges the excess electric charge that builds up in the pixel electrode 16. That is, the excess electric charge that builds up in the pixel electrode 16 is distributed between the capacitor element 15 and the transistor 12, and sudden changes of the electric potential of the source electrode or the drain electrode of the transistor 12 are thus relieved.

In this embodiment, the capacitor element 15 is formed by a laminate of a semiconductor, a gate insulating film, and a gate electrode, and has a capacitance value of several hundreds of fF. Specifically, the capacitor element 15 has a capacitance value of 100 to 200 fF. However, the present invention is not limited to this, and the material constituting the capacitor element 15 and the shape of the capacitor element 15 can be set arbitrarily. Further, there are no specific limitations of the capacitance value of the capacitor element 15, and the constituent material and shape may be arbitrarily set so that a desired capacitance value can be obtained.

Further, the fact that the value of (a channel length L)/(a channel width W) of the transistor 12 is set to a value equal to or greater than 10 can be given as a characteristic other than those described above. The L/W value is normally from 0.1 to 2, but is set to a value equal to or greater than 10 with the present invention. The capacitance value between the gate and the source of the transistor 12 itself is such large, and the transistor 12 can also serve as a capacitor element.

Further, a light-emitting element is structured by wide range of materials covering such as organic materials, inorganic materials, thin film materials, bulk materials, and dispersion materials. From among these materials, organic light-emitting diodes (OLEDs) which are structured mainly by organic materials can be given as typical light-emitting elements. OLEDs have a structure in which there are an anode, a cathode, and a light-emitting layer sandwiched between the anode and the cathode. The light-emitting layer is structured by one or a plurality of materials selected from the materials described above. Further, light emission caused by return to a ground state from a singlet excitation state (fluorescence), and light emission caused by return to a ground state from a triplet excitation state (phosphorescence) are included in types of luminescence that occur in the light emitting layer.

Next, typical cross sectional structures for the semiconductor device pixel shown in FIG. 1A are shown in FIGS. 2A to 2C. FIGS. 2A to 2C show a state up through the manufacture of the transistor and the light-emitting element on a substrate. FIG. 2A is a cross sectional diagram along the line A-A' of the pixel of FIG. 1A, and is a cross sectional diagram of the transistor 11 and the transistor 13. FIG. 2B is a cross sectional diagram along the line B-B', and is a cross sectional diagram of the transistor 12, the electric power source line 18, and the signal line 17. FIG. 2C is a cross sectional diagram along the line C-C', and is a cross sectional diagram of the capacitor element 15 and the pixel electrode 16.

Reference numeral 101 in FIGS. 2A to 2C denotes a substrate. Glass substrates, ceramic substrates, quartz substrates, silicon substrates, or plastic substrates (including plastic films) can be used for the substrate 101. Further, reference numeral 102 denotes a base film, which includes a silicon nitride oxide film, a silicon oxynitride film, or a laminate film of these films.

A semiconductor that constitutes an active layer of the transistor 11 and the transistor 13 is formed over the base film 102. The active layer has a source region 103, a drain region 104, and a source region 107. LDD regions 105$a$ to 105$d$, and channel forming regions 106$a$ and 106$b$, are formed between the source region 103 and the drain region 104, and LDD regions 105$e$ to 105$h$, and channel forming regions 106$c$ and 106$d$, are formed between the drain region 104 and the source region 107, respectively. Note that the active layer of the transistors 11 and 13 is an n-type impurity region. Further, semiconductors 108 to 110 that are to be the active layers of the transistor 12, and a semiconductor that constitutes the capacitor element 15 are formed at the same time. A p-type impurity region 111 and an intrinsic semiconductor region 112 are formed in the semiconductor that constitutes the capacitor element 15.

A gate insulating film 113 is formed over the semiconductors by using a silicon oxide film, a silicon oxynitride film (corresponding to a silicon compound film containing Si at 25 to 35 atomic %, oxygen at 55 to 65 atomic %, nitrogen at 1 to 20 atomic %, and hydrogen at 0.1 to 10 atomic %), an aluminum nitride film, an aluminum oxide film, an aluminum oxynitride film, or a laminate film of these insulating films and a silicon nitride film. The gate insulating film 113 functions as a gate insulating film for the transistors 11 to 13. Further, the gate insulating film functions as a dielectric of the capacitor element 15.

A metallic layer is patterned on the gate insulating film 113 to form gate electrodes 114 and 115 of the transistor 11, gate electrodes 116 and 117 of the transistor 13, and gate electrodes 118 and 119 of the transistor 12. Note that the shapes of a first layer electrode (tantalum nitride film) and a second layer electrode (tungsten film) of the gate electrodes of the transistors 11 and 13 differ from each other. The first layer electrode has a wider line width than the second layer electrode. JP 2002-57162 A, by the applicants of the present invention, may be referred to regarding reasons for, and advantages of, this characteristic formation method and adopting this type of structure of gate electrode. Further, electrodes 120 and 121, which construct the capacitor element 15, are formed together with the gate electrodes.

As a first inorganic insulating film 122, a silicon nitride oxide film (corresponding to a silicon compound film containing Si at 25 to 35 atomic %, oxygen at 15 to 30 atomic %, nitrogen at 20 to 35 atomic %, and hydrogen at 15 to 25 atomic %), or a silicon nitride film formed by plasma CVD, is formed to have a thickness of 0.1 to 1 μm (preferably from 0.2 to 0.5 μm) over the gate electrodes, and over the electrodes that construct the capacitor element 15. The first inorganic insulating film 122 contains hydrogen at a concentration of 15 to 25 atomic %, and therefore can be made to function as a hydrogen supply source by heat treatment, so that hydrogen termination of the semiconductor, which constitutes an active layer, can be performed.

A first organic resin film 123 containing a positive photosensitive organic resin is formed over the first inorganic insulating film 122 at a thickness of 0.7 to 5 μm (preferably from 2 to 4 μm). The first organic resin film 123 is applied by spin coating and firing. Portions at which it is desired to form opening portions are then exposed to light by using a photomask. Specifically, portions for forming wirings of the transistor 11 and the transistor 13, the gate electrodes 118 and 119 of the transistor 12, and a portion for taking the capacitance, are exposed to light. If an opening portion is formed in the first organic resin film 123, the first inorganic insulating film 122 is in a state of being partially exposed in the opening portion.

A silicon oxynitride film, a silicon nitride film, an aluminum nitride film, or an aluminum oxynitride film is then formed at a thickness of 0.1 to 0.2 μm as a second inorganic insulating film 124, covering the first inorganic insulating film 122 exposed partially and the first organic resin film 123. The second inorganic insulating film 124 functions to suppress the passage of moisture to and from the first organic resin film 123.

A contact hole is formed in the gate insulating film 113, the first inorganic insulating film 122, and the second inorganic insulating film 124 by dry etching. By patterning a conductive film formed so as to cover the contact hole, laminates of a 0.1 μm Ti film, a 0.35 μm Al film, and a 0.15 μm Ti film are formed as source wirings 125 and 127, and a drain wiring 126. A wiring 128 corresponding to the electric power source line 18, a wiring 129 corresponding to the signal line 17, and a wiring 130 that connects a p-type impurity region 111 and a pixel electrode 131 are formed at the same time.

Note that a laminate of the gate electrodes 118 and 119 and the wiring 128, with the first inorganic insulating film 122 and the second inorganic insulating film 124 interposed therebetween, corresponds to a capacitor element in FIG. 2B. That is, the above-mentioned laminate and a laminate constructed from the gate insulating film 113 interposed between the semiconductors 108 to 110 and the gate electrodes 118 and 119, function as two capacitor elements with this structure. Conventional capacitance values of 100 to 500 fF per single transistor can thus be increased to 1000 to 1200 fF. The two laminates described above maintain the voltage between the gate electrode and source of the transistor 12.

Further, a laminate of the gate electrodes 120 and 121 and the wiring 130, with the first inorganic insulating film 122 and the second inorganic insulating film 124 interposed therebetween, corresponds to a capacitor element in FIG. 2C. This capacitor element plays a role in maintaining the voltage of the gate electrode of the transistor 12. A laminate of an intrinsic semiconductor 112 and the gate electrodes 120 and 121, with the gate insulating film 113 interposed therebetween, also functions as a capacitor element with this structure. This capacitor element functions as a protecting means.

Next, a pixel electrode 131 that contacts the wiring 130 is formed by patterning a transparent conductive film such as ITO. A second organic resin film 132 made from a positive photosensitive organic resin is formed on the pixel electrode 131. The second organic resin film 132 is applied by spin coating and firing. A portion at which it is desired to form an opening portion is then exposed to light by using a photomask. A state in which a portion of the pixel electrode 131 is exposed in the opening portion results when the opening portion is formed.

Note that roundness can be provided in the cross section of the opening portion by using a negative or a positive organic resin film with this structure. It therefore becomes possible to have good coverage of a light-emitting layer and a counter electrode formed later. Defects, called shrink, in which a light-emitting region is reduced in size, can be decreased.

An inorganic insulating film that contains nitrogen is then patterned, forming a third inorganic insulating film 124 at a thickness of 0.1 to 0.2 μm so as to cover the exposed pixel electrode 131 and the second organic resin film 132. A light-emitting layer 134 is formed next by evaporation. In addition, a counter electrode 135 is formed by evaporation. A laminate of the pixel electrode 131, the light-emitting layer 134, and the counter electrode 135 corresponds to a light-emitting element. A TFT and the light-emitting element are thus formed on the substrate 101.

Next, a photograph of a panel having an actually manufactured pixel is shown in FIG. 3, magnified to approximately 635 times with an optical microscope. Concrete specifications for the pixels are a channel length of 390 μm and a channel width of 5 μm for the transistor 12, and channel lengths of 4.5 μm for the transistors 11 and 13. Further, the pixel pitch is 189 μm vertically, and 63 μm horizontally, with an aperture ratio of 40%.

The present invention, having the structure described above, disposes the resistor element 14 between the pixel electrode 16 and the transistor 12 so that the excess electric charge that builds up in the pixel electrode 16 is not supplied all at once and directly to the transistor 12. Sudden changes in the electric potential of the source electrode or the drain electrode of the transistor 12 are thus relieved. Further, the capacitor element 15 is disposed between the pixel electrode 16 and the transistor 12, and the excess charge that builds up in the pixel electrode 16 is distributed to the capacitor element 15 and the transistor 12. Sudden changes in the electric potential of the source electrode or the drain electrode of the transistor 12 are thus relieved. The present invention prevents electrostatic discharge damage by relieving sudden changes in the electric potential of the source electrode or the drain electrode of the transistor caused by the electric charge that builds up in the pixel electrode. Further, the present invention prevents electrostatic discharge damage during manufacturing processes, and in particular, prevents electrostatic discharge damage in a state up through the manufacture of the pixel electrode.

Embodiment Mode 2

Figure 6A:
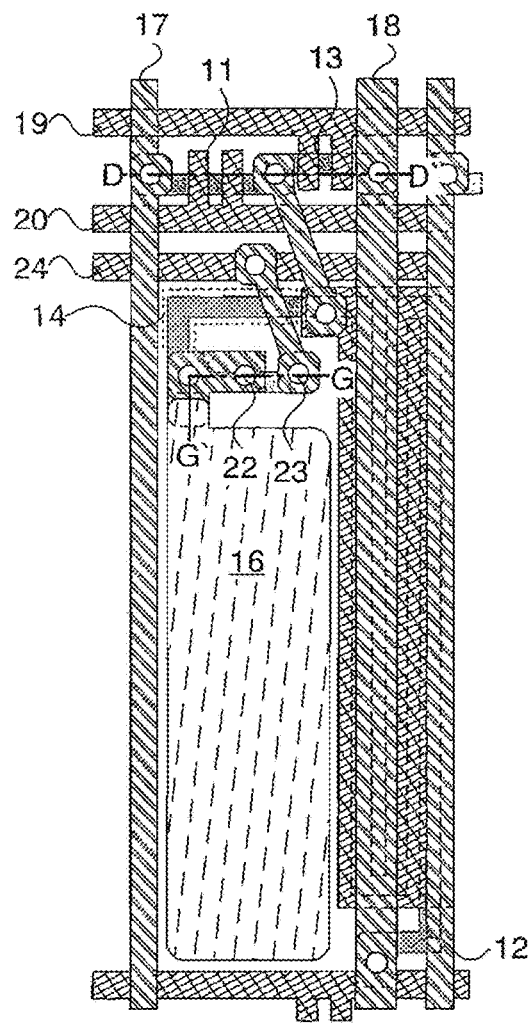
FIGS. 6A and 6B are top views and a circuit diagram, respectively, of a semiconductor device of the present invention.
Figure 6B:
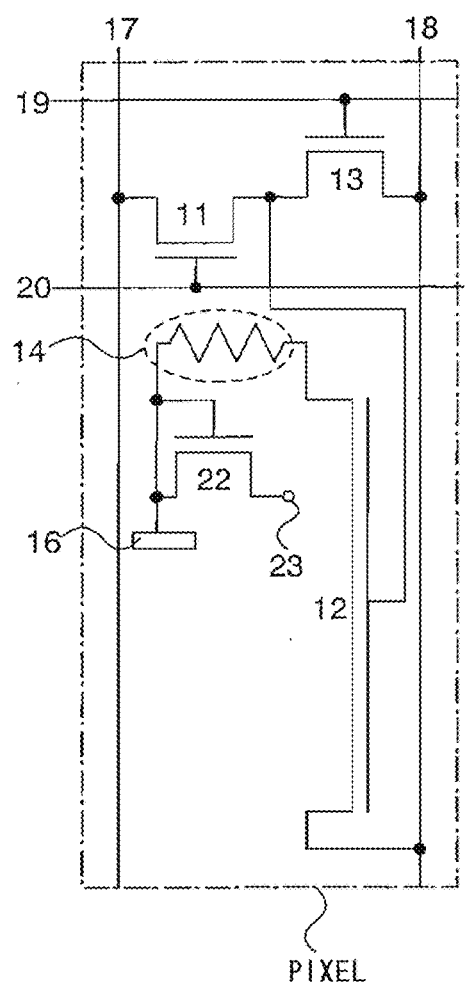
Figure 7A:
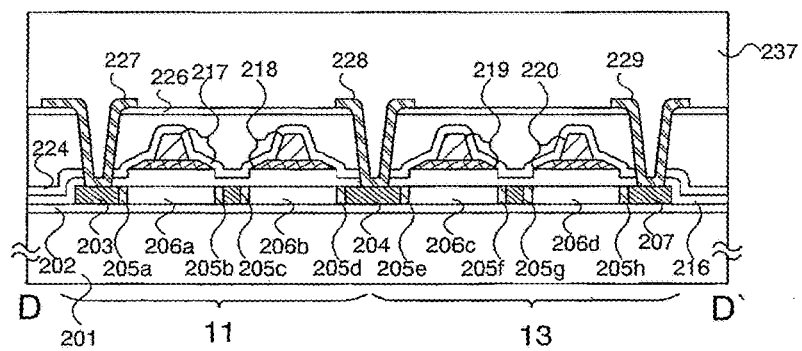
FIGS. 7A to 7D are cross sectional diagrams of a semiconductor device of the present invention.
Figure 7B:
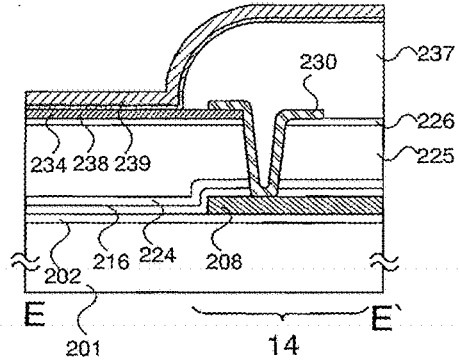
Figure 7C:
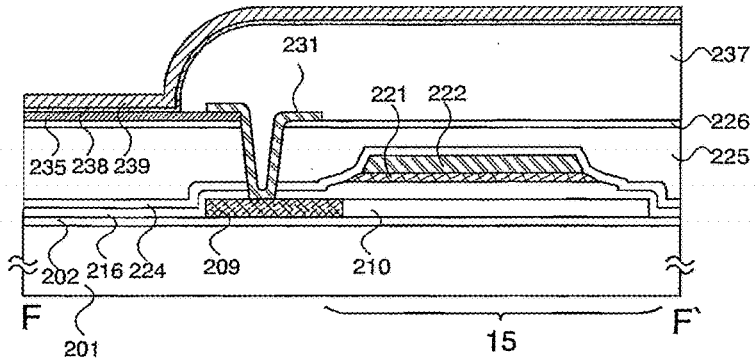
Figure 7D:
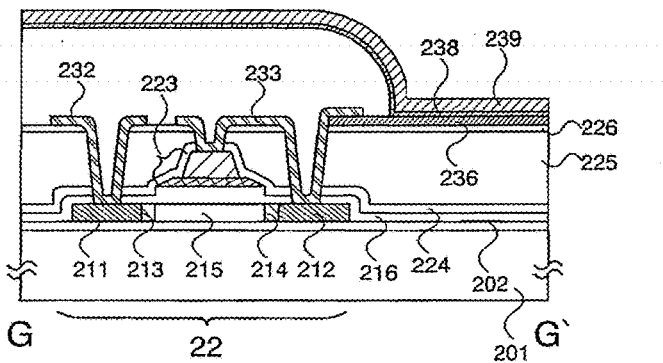
Figure 8:
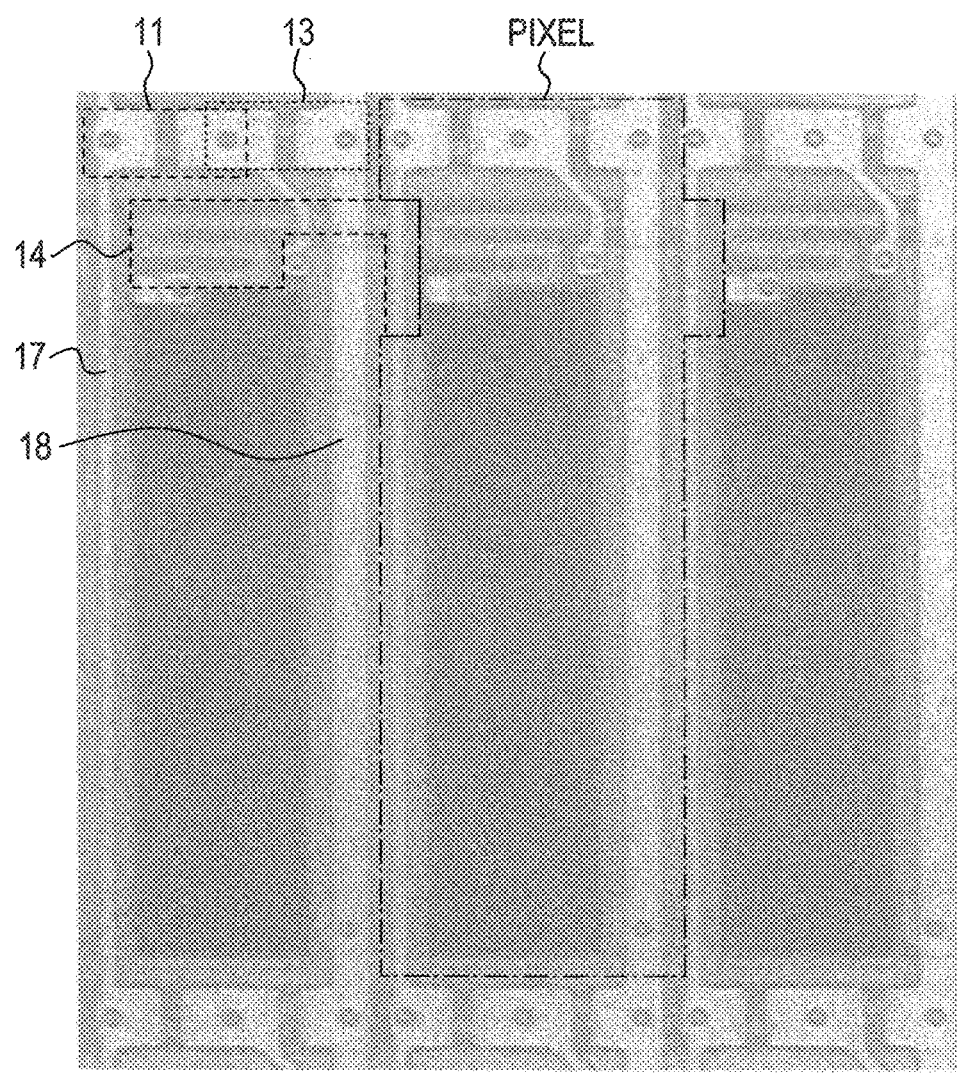
FIG. 8 is a photograph of a top view of a pixel provided in a semiconductor device of the present invention.
Figure 9:
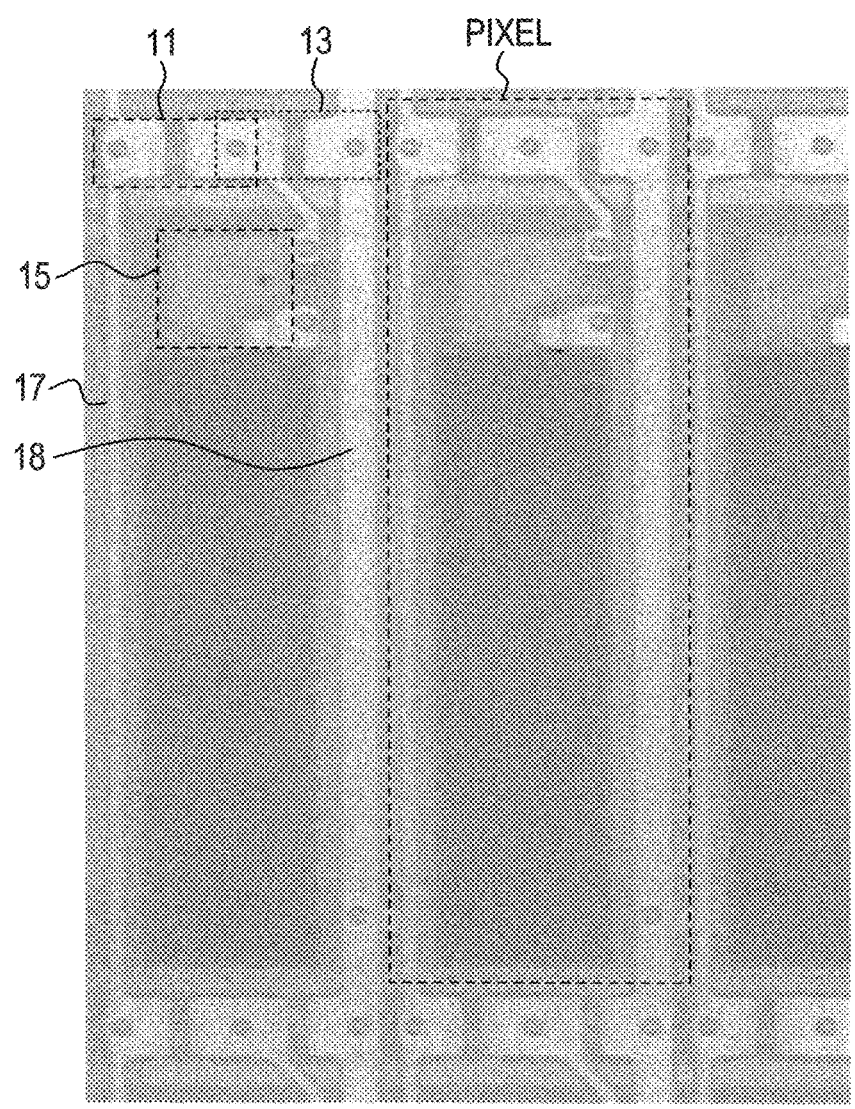
FIG. 9 is a photograph of a top view of a pixel provided in a semiconductor device of the present invention.

An embodiment mode of the present invention is explained using FIGS. 4A to 9. FIGS. 4A to 6B show a state up through the manufacture of a pixel electrode. FIG. 4A to 6A are schematic diagrams of a top view (masking diagram) of a pixel of a semiconductor device, and FIG. 4B to 6B are circuit diagrams that schematically express a typical circuit structure thereof. FIGS. 7A to 7D are cross sectional diagrams of the pixels of FIGS. 4A to 6A. FIGS. 8 and 9 are photographs of a panel having an actually manufactured pixel, magnified to approximately 695 times with an optical microscope.

Each of the pixels shown in FIGS. 4A to 6B is disposed in a region surrounded by the signal line 17 and the electric power source line 18, which are arranged in a column direction, and the scanning line 20 and the reset line 19, which are arranged in a row direction. Further, each of the pixels has the transistors 11 to 13, and the pixel electrode 16. Each of the pixels shown in FIGS. 4A and 4B have the resistor element 14 that corresponds to the protecting means 21. On the other hand, each of the pixels shown in FIGS. 5A and 5B has the capacitor element 15 that corresponds to the protecting means 21. Each of the pixels shown in FIGS. 6A and 6B has the resistance means 14 and a transistor 22 with a connection between a gate and a drain thereof, that correspond to the protecting means 21.

The fact that the resistor elements 14, which are the protecting means 21, are disposed can be given as a characteristic of each of the pixels shown in FIGS. 4A and 4B. The resistor element 14 relieves sudden changes in the electric potential of the transistor 12 caused by excess electric charge that builds up in the pixel electrode 16. More specifically, sudden changes in the electric potential of a source electrode or a drain electrode of the transistor 12 can be relieved by disposing the resistor element 14 between the pixel electrode 16 and the transistor 12, so that the excess electric charge that builds up in the pixel electrode 16 is not supplied all at once and directly to the transistor 12.

In this embodiment mode, the resistor element 14 is formed by a semiconductor, and has a resistance value of several tens of kΩ. Specifically, it has a resistance value of 20 kΩ to 200 kΩ. However, the present invention is not limited to this, and a metal or the like for forming a gate electrode or a wiring may also be used as a material for forming the resistor element 14. Further, there are also no specific limitations placed on the shape of the resistor element 14 disposed within the pixel, and the shape can be arbitrarily set. In addition, there are also no specific limitations placed on the resistance value of the resistor element 14, and the constituent materials and shape may be arbitrarily set so that a desired resistance value can be obtained.

Figure 5A:
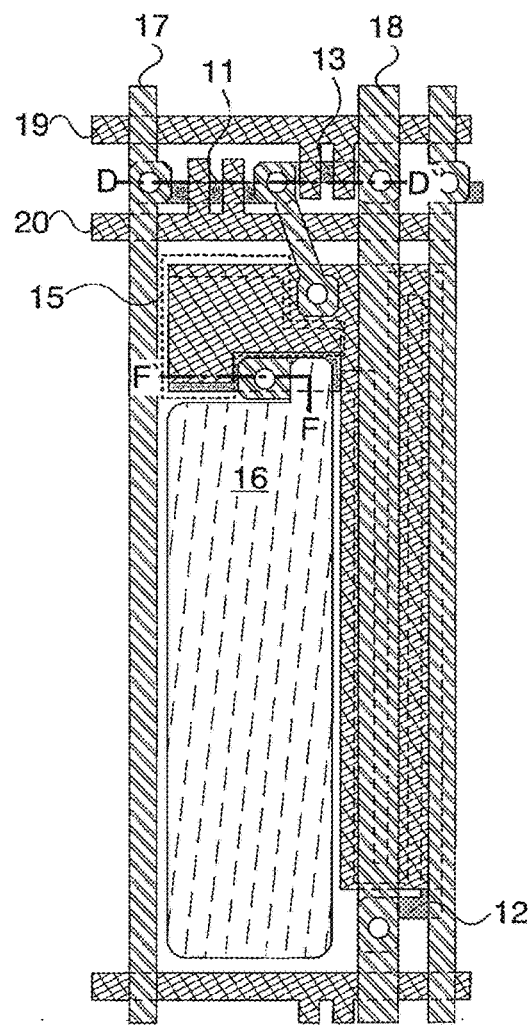
FIGS. 5A and 5B are top views and a circuit diagram, respectively, of a semiconductor device of the present invention.
Figure 5B:
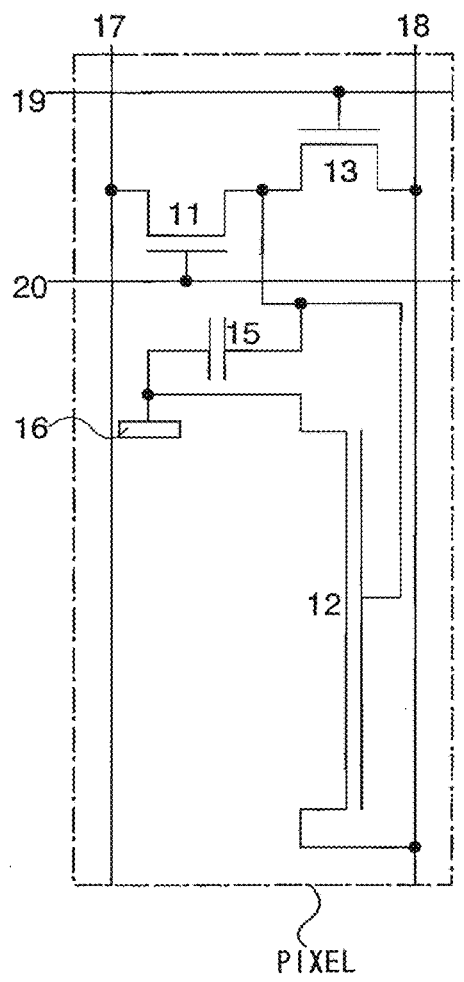

The fact that the capacitor elements 15, which are the protecting means 21, are disposed can be given as a characteristic of each of the pixels shown in FIGS. 5A and 5B. The capacitor element 15 relieves sudden changes in the electric potential of the transistor 12 caused by the excess electric charge that builds up in the pixel electrode 16. More specifically, the capacitor element 15 accumulates or discharges the excess electric charge that builds up in the pixel electrode 16. That is, the excess electric charge that builds up in the pixel electrode 16 is distributed to the capacitor element 15 and the transistor 12, and sudden changes of the electric potential of the source electrode or the drain electrode of the transistor 12 are thus relieved.

The capacitor element 15 is formed by a laminate of a semiconductor, a gate insulating film, and a gate electrode in this embodiment, and has a capacitance value of several hundreds of fF. Specifically, the capacitor element 15 has a capacitance value of 100 to 200 fF. However, the present invention is not limited to this, and the materials forming the capacitor element 15 and the shape of the capacitor element 15 can be set arbitrarily. Further, there are no specific limitations on the capacitance value of the capacitor element 15, and the constituent materials and shape may be arbitrarily set so that a desired capacitance value can be obtained.

The fact that the resistor element 14 and the gate-drain connected transistor 22, which are the protecting means 21, are disposed can be given as a characteristic of each of the pixels shown in FIGS. 6A and 6B. The gate-drain connected transistor 22 relieves sudden changes in the electric potential of the transistor 12 caused by excess electric charge that builds up in the pixel electrode 16. More specifically, a source electrode 23 of the transistor 22 is connected to the electric power source line 18, or to an electric power source line 24, to which the counter electrode of the light-emitting element is connected. The excess charge that builds up in the pixel electrode 16 is discharged to the electric power source line 18 or the electric power source line 24. Sudden changes in the electric potential of the source electrode or the drain electrode of the transistor 12 are thus relieved. If the source electrode 23 is assumed to be connected to the electric power source line 18, the excess charge that builds up in the pixel electrode 16 is discharged to the electric power source line 18, and the electric potential of the pixel electrode 16 is set to the electric potential of the electric power source line 18 (an electric power source potential $V_{DD}$). Further, if the source electrode 23 is connected to the electric power source line 24, the excess electric charge that builds up in the pixel electrode 16 is discharged to the electric power source line 24, and the electric potential of the pixel electrode 16 is set to the electric potential of the electric power source line 24 (a ground electric potential $V_{SS}$). The electric potential of the pixel electrode 16 is thus set to the electric power source potential $V_{DD}$ or the ground electric potential $V_{SS}$, and sudden changes in the electric potential of the source electrode or the drain electrode of the transistor 12 are relieved.

Note that a PN junction diode or a PIN junction diode may also be used as a substitute for the transistor 22. If a diode is used, one electrode of the diode is connected to the pixel electrode, and the other electrode is connected to an electric power source line. Further, elements having structures other than those described above may also be used, provided that the elements have a rectifying action.

Further, the fact that the value of (the channel length L)/(the channel width W) of the transistor 12 is set to a value equal to or greater than 10 can be given as a characteristic differing from those described above. The value of L/W is normally from 0.1 to 2, but is set equal to or greater than 10 with the present invention. The capacitance between the gate and the source of the transistor 12 itself thus becomes large, and the transistor 12 can also serve as a capacitor element.

Next, typical cross sectional structures for the semiconductor device pixel shown in FIGS. 4A to 6A are shown in FIGS. 7A to 7D. FIGS. 7A to 7D show a state up through the manufacture of the transistor and the light-emitting element on a substrate. FIG. 7A is a cross sectional diagram along the line D-D' of the pixel of FIGS. 4A to 6A, and is a cross sectional diagram of the transistor 11 and the transistor 13. FIG. 7B is a cross sectional diagram along the line E-E' of the pixel of FIG. 4A, and is a cross sectional diagram of the resistor element 14 and the pixel electrode 16. FIG. 7C is a cross sectional diagram along the line F-F' of the pixel of FIG. 5A, and is a cross sectional diagram of the capacitor element 15 and the pixel electrode 16. FIG. 7D is a cross sectional diagram taken along the line G-G' of the pixel of FIG. 6A, and is a cross sectional diagram of the transistor 22 and the pixel electrode 16.

Reference numeral 201 in FIGS. 7A to 7D denotes a substrate. Glass substrates, ceramic substrates, quartz substrates, silicon substrates, or plastic substrates (including plastic films) can be used for the substrate 201. Further, reference numeral 202 denotes a base film, which contains a silicon nitride oxide film, a silicon oxynitride film, or a laminate film of these films.

A semiconductor that constitutes an active layer of the transistor 11 and the transistor 13 is formed on the base film 202. The active layer has a source region 203, a drain region 204, and a source region 207. LDD regions 205a to 205d, and channel forming regions 206a and 206b, are formed between the source region 203 and the drain region 204, and LDD regions 205e to 205h, and channel forming regions 206c and 206d, are formed between the drain region 204 and the source region 207, respectively. Note that the active layer of the transistors 11 and 13 is an n-type impurity region. Further, a semiconductor 208 that constitutes the resistor element 14, and a semiconductor that constitutes the capacitor element 15 are formed at the same time. A p-type impurity region 209 and an intrinsic semiconductor 210 are formed for the semiconductor that constitutes the capacitor element 15. In addition, a semiconductor that makes up an active layer of the transistor 22 is formed. The active layer has a source region 211 and a drain region 212. LDD regions 213 and 214, and a channel forming region 215, are formed between the source region 211 and the drain region 212.

A gate insulating film 216 is formed on the semiconductors by using a silicon oxide film, a silicon oxynitride film (corresponding to a silicon compound film containing Si at 25 to 35 atomic %, oxygen at 55 to 65 atomic %, nitrogen at 1 to 20 atomic %, and hydrogen at 0.1 to 10 atomic %), an aluminum nitride film, an aluminum oxide film, an aluminum oxynitride film, or a laminate film of these insulating films and a silicon nitride film. The gate insulating film 216 functions as a gate insulating film for the transistors 11, 13, and 22. Further, the gate insulating film 216 functions as a dielectric of the capacitor element 15.

A metallic layer is patterned on the gate insulating film 216, forming gate electrodes 217 and 218 of the transistor 11, gate electrodes 219 and 220 of the transistor 13, electrodes 221 and 222 that constitute the capacitor element 15, and a gate electrode 223 of the transistor 22. Note that a first layer electrode (tantalum nitride film) and a second layer electrode (tungsten film) differ in shape each other. The first layer electrode has a wider line width than the second layer electrode.

An insulating film containing silicon, such as silicon nitride, is formed as a first interlayer insulating film 224 at a thickness of 0.1 μm to 0.2 μm on the gate electrodes and the electrodes that constitute the capacitor element 15. An insulating film containing an organic resin such as acrylic, polyimide, polyamide, or BCB (benzocyclobutene) is formed next as a second interlayer insulating film 225 to have a thickness of 0.7 μm to 5 μm (preferably, 2 to 4 μm). An insulating film that contains silicon, such as a silicon nitride film, is then formed by sputtering to have a thickness of 0.1 μm to 0.2 μm as a third interlayer insulating film 226. Note that the second interlayer insulating film 225 relieves unevenness due to the transistors formed on a substrate 201, and has strong implications in flattening. A film having superior flatness characteristics is therefore preferable.

A transparent conductive film such as ITO is then patterned, forming pixel electrodes 234 to 236 to have a thickness of 0.1 μm to 0.2 μm. A contact hole is then formed in the gate insulating film 216, the first interlayer insulating film 224, the second interlayer insulating film 225, and the third interlayer insulating film 226 by dry etching. A laminate of a 0.1 μcm Ti film, a 0.35 μm Al film, and a 0.15 μm Ti film is formed as source wirings 227, 229, and 232, and drain wirings 228 and 233, by patterning a conductive film formed so as to cover the contact hole. A wiring 230 that connects the semiconductor 208 and the pixel electrode 234, and a wiring 231 that connects the p-type impurity region 209 and the pixel electrode 235 are formed at the same time. Note that the drain wiring 233 connects the drain electrode and the gate electrode of the transistor 22.

An insulating film made from an organic resin such as acrylic, polyimide, polyamide, or BCB (benzocyclobutene) is formed as a fourth interlayer insulating film 237 at a thickness of 0.7 to 5 μm (preferably from 2 to 4 μm) on the pixel electrode and the wirings. The fourth interlayer insulating film 237 is applied by spin coating and firing. A portion at which it is desired to form an opening portion is then exposed to light by using a photomask. A state in which portions of the pixel electrodes 234 to 236 are exposed in the opening portion results when the opening portion is formed.

Note that roundness can be provided in the cross section of the opening portion by using the organic resin film with this structure. It therefore becomes possible to have good coverage of a light-emitting layer and a counter electrode formed later. Defects, called shrink, in which a light-emitting region is reduced in size, can be decreased.

A light-emitting layer 238 is formed next by evaporation, and in addition, a counter electrode 239 is formed by evaporation. A laminate of the pixel electrodes 234 to 236, the light-emitting layer 238, and the counter electrode 239 corresponds to a light-emitting element. A TFT and the light-emitting element can thus be formed over the substrate 201.

Photographs of panels having actually manufactured pixels are shown next in FIGS. 8 and 9, magnified to approximately 695 times with an optical microscope. Each of the pixels shown in FIG. 8 corresponds to the pixel shown in FIGS. 4A and 4B, and the pixels shown in FIG. 9 correspond to the pixel shown in FIGS. 5A and 5B. Concrete specifications are a channel length of 390 μm and a channel width of 5 μm for the transistor 12, and channel lengths of 4.5 μm for the transistors 11 and 13. Further, the pixel pitch is 189 μm vertically, and 63 μm horizontally. Note that the shape of the resistor element 14 in the pixel shown in FIG. 8 differs from that of the pixel shown in FIG. 4A, taking on an S-shape. Furthermore, the transistors 11 and 13 are covered by wirings in the pixels shown in both FIGS. 8 and 9.

The present invention, having the structure described above, disposes the resistor element 14 between the pixel electrode 16 and the transistor 12 so that the excess electric charge that builds up in the pixel electrode 16 is not supplied all at once and directly to the transistor 12. Sudden changes in the electric potential of the source electrode or the drain electrode of the transistor 12 are thus relieved. Further, the capacitor element 15 is disposed between the pixel electrode 16 and the transistor 12, and the excess electric charge that builds up in the pixel electrode 16 is distributed to the capacitor element 15 and the transistor 12. Sudden changes in the electric potential of the source electrode or the drain electrode of the transistor 12 are thus relieved. Furthermore, the gate-drain connected transistor 22 is disposed between the pixel electrode 16 and the transistor 12, and the excess electric charge that builds up in the pixel electrode 16 is discharged to the electric power source line, whereby sudden changes in the electric potential of the source electrode or the drain electrode of the transistor 12 are thus relieved. The present invention thus prevents electrostatic discharge damage by relieving sudden changes in the electric potential of the source electrode or the drain electrode of the transistor due to the electric charge that builds up in the pixel electrode. Further, the present invention prevents electrostatic discharge damage during manufacturing processes, and in particular, prevents electrostatic discharge damage in a state up through the manufacture of the pixel electrode.

Embodiment Mode 3

Circuit diagrams in a state up through the manufacture of the pixel electrode are shown in Embodiment Modes 1 and 2, discussed above, but a circuit diagram of a state up through the manufacture of a light-emitting element is explained in this embodiment mode by using FIGS. 10A to 10D.

Pixels shown in FIGS. 10A to 10D correspond to the pixels shown in FIGS. 1B, 4B, 5B, and 6B, respectively. A protecting means, which corresponds to one or a plurality of elements selected from the resistor element 14, the capacitor element 15, and the rectifying element 22, is formed between the transistor 12 and a pixel electrode of a light-emitting layer 25 in all of the pixels. Further, a counter electrode of the light-emitting element 25 is connected to the electric power source line 24.

In addition, although the transistors 11 and 13 are n-channel and the transistor 12 is p-channel in each of the pixels shown in FIGS. 10A to 10D, the present invention is not limited in particular to these transistor conductivity types. Further, the structure of the pixels is not limited to the structure having the transistors 11 to 13 and the protecting means. The essential structure of the present invention is one in which the protecting means is formed in each pixel, and the protecting means is disposed between the pixel electrode of the light-emitting element and the source electrode or the drain electrode of the transistor. For cases in which it is assumed that the protecting means is not disposed, the source electrode or the drain electrode of the transistor is connected to the pixel electrode of the light-emitting element.

Figure 10A:
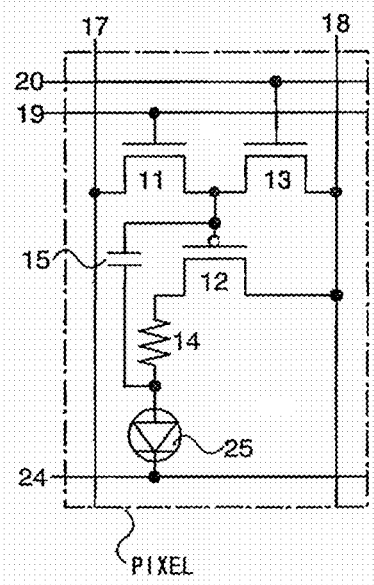
FIGS. 10A to 10D are circuit diagrams of a semiconductor device of the present invention.
Figure 10B:
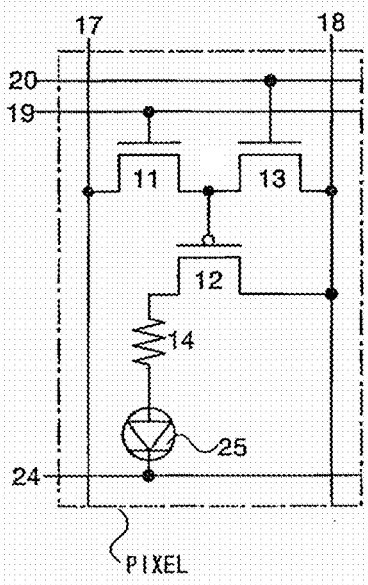
Figure 10C:
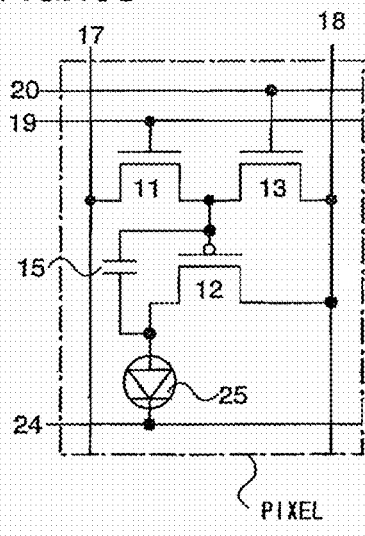
Figure 10D:
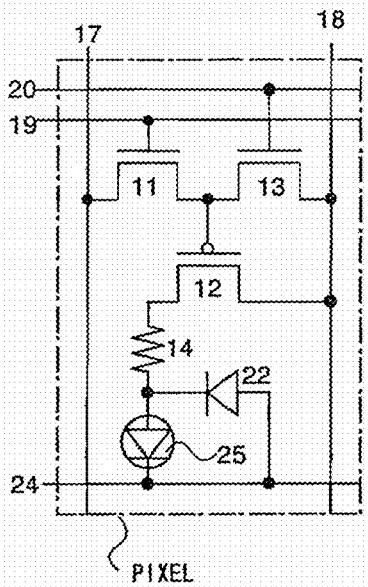

Note that a transistor having a connection between a drain electrode and a gate electrode thereof, or a diode, may be used as the rectifying element 22 in FIG. 10D.

This embodiment mode can be arbitrarily combined with Embodiment Modes 1 and 2.

Embodiment Mode 4

In this embodiment mode, a structure of the entire semiconductor device will be described with FIGS. 11A to 12B.

First, an element substrate provided with transistors at a state of being sealed by a sealing material will be described using FIGS. 11A and 11B.

Figure 11A:
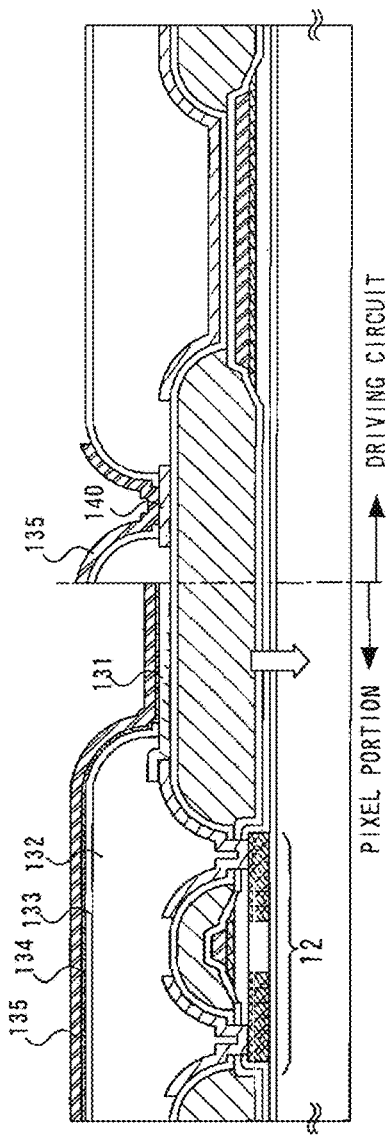
FIGS. 11A and 11B are cross sectional diagrams of a semiconductor device of the present invention.

FIG. 11A is a cross sectional diagram simply showing a pixel portion and a driving circuit of the pixel shown in FIGS. 1 and 2. In the pixel portion shown in FIG. 11A, although the L/W value of a transistor 12 is originally set more than 10, but shown here is simplified. Further, in the driving circuit, a part of counter electrode 135 is in contact with a leading out wiring 140. The leading out wiring 140 is connected to an input terminal, which is in contact with a flexible print circuit (FPC).

Figure 11B:
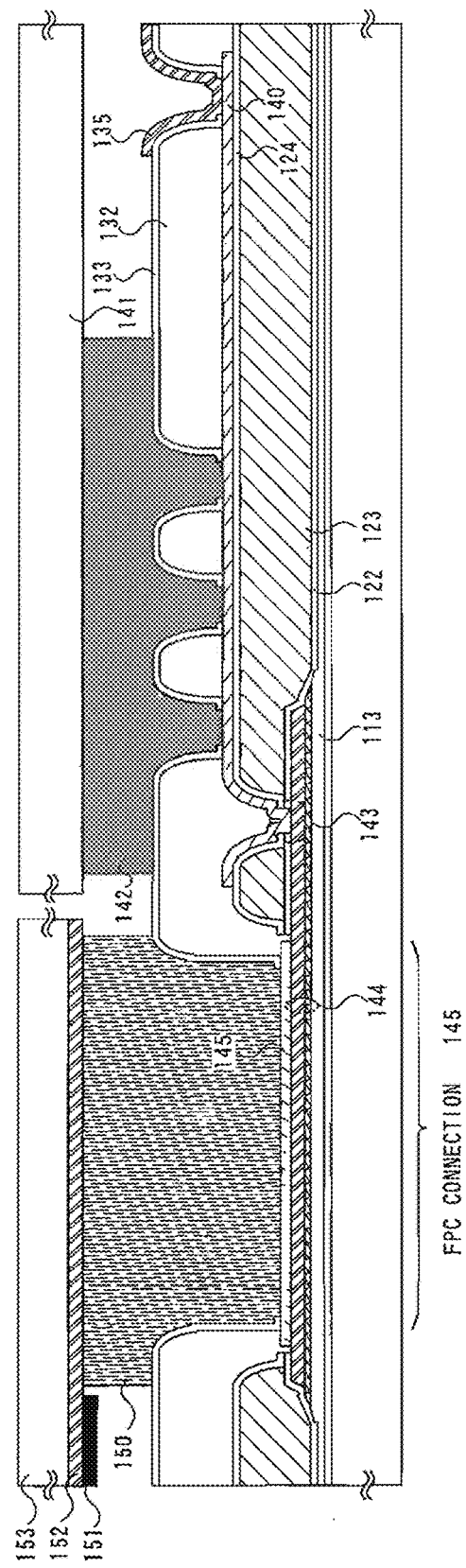
Figure 12A:
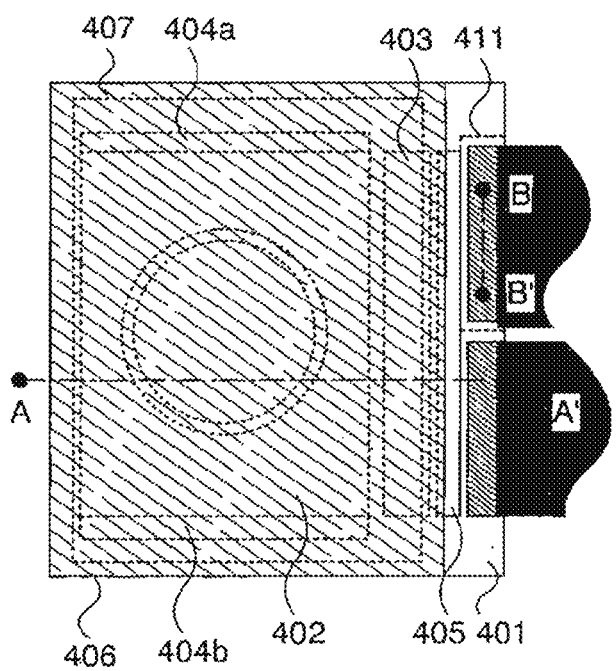
FIGS. 12A to 12C are entire view of a semiconductor device of the present invention.
Figure 12B:
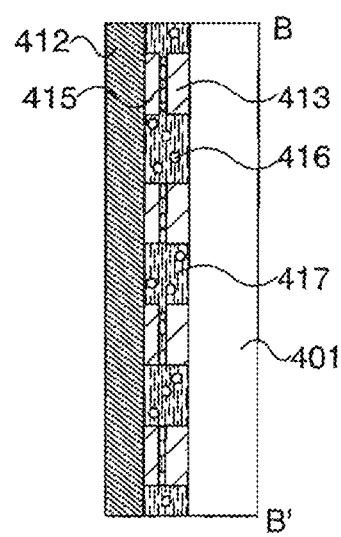
Figure 12C:
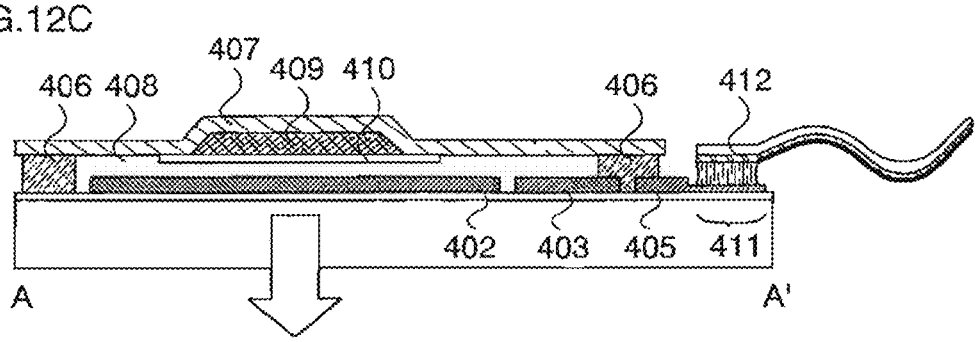

FIG. 11B illustrates a cross sectional diagram of a part being in contact with the FPC (FPC connection 145). A lead wiring 144 formed from the same electronic conductor as gate electrodes is provided on a gate insulating film 113. The lead wiring 144 is in contact with the leading out wiring 140 via a contact hole 143 in an opening of a first organic resin 123. An opening is provided on the lead wiring 144, further, a first inorganic insulating film 122 and a second inorganic insulating film 124 are etched and removed, and the lead wiring 144 is in an exposed state thereby. An input terminal 145 formed from the same transparent electronic conductor as a pixel electrode is provided on the lead wiring 144. The input terminal 145 is in contact with a terminal 152 of the FPC via a conductive resin 150 with anisotropy. Reference numeral 151 denotes a protective film of the wirings; 153, a film. And, reference numeral 141 denotes a covering material, is sealed by a sealing material 142 having high air tightness and less degassing. Subsequently, a structure of the entire semiconductor device will be described with FIGS. 12A to 12C. FIG. 12A is a top view of a semiconductor device formed by sealing an element substrate in which transistors are formed with a sealing material. FIG. 12B is a cross sectional diagram along a line B-B' in FIG. 12A. FIG. 12C is a cross sectional diagram along a line A-A' in FIG. 12A.

In FIGS. 12A to 12C, a pixel portion (display portion) 402; a signal line driving circuit 403, scanning line driving circuits 404a and 404b, and a protection means 405, which are provided to surround the pixel portion 402; are all located on a substrate 401, and a seal material 406 is provided to surround all these. The structure of the pixel portion 402 preferably refers to Embodiment modes described above and the description thereof. As the seal material 406, a glass material, a metallic material (typically, a stainless steel material), a ceramic material, or a plastic material (including a plastic film) may be used.

The seal material 406 may be provided to partially overlap with the signal line driving circuit 403, the scanning line driving circuits 404a and 404b, and the protection means 405. A sealing material 407 is provided using the seal material 406, so that a closed space 408 is formed by the substrate 401, the seal material 406, and the sealing material 407. A hygroscopic agent (barium oxide, calcium oxide, or the like) 409 is provided in advance in a concave portion of the sealing material 407, so that it has a function of absorbing moisture, oxygen, and the like to keep the atmosphere clean in an inner portion of the above closed space 408, thereby suppressing the deterioration of a light-emitting element. The concave portion is covered with a covering material 410 with a fine mesh shape. The covering material 410 allows air and moisture to pass therethrough but not the hygroscopic agent 409. Note that the closed space 408 is preferably filled with a noble gas such as nitrogen or argon, and can be also filled with a resin or a liquid if it is inert.

Also, an input terminal portion 411 for transmitting signals to the signal line driving circuit 403 and the scanning line driving circuits 404a and 404b is provided on the substrate 401. Data signals such as video signals are transferred to the input terminal portion 411 through a FPC (flexible printed circuit) 412. With respect to a cross section of the input terminal portion 411, as shown in FIG. 12B, an input wiring 413 formed from a wiring which is formed together with the scanning wiring or the signal wiring is electrically connected with a wiring 415 provided on the FPC 412 side through a resin 417 in which electric conductors 416 are dispersed. Note that a spherical polymer compound plated with gold or silver is preferably used for the electric conductors 416.

In this embodiment mode, the protection means is provided between the input terminal 411 and the signal line driving circuit 403, and in pixel portion 402. Upon being input an electrostatic signal such as an unexpected pulse signal therebetween, the protection means 405 provided between the input terminal portion 411 and the signal line driving circuit 403 releases the pulse signal to the outside. Of course, the protection means may be provided in other locations, for example, a location between the pixel portion 402 and the signal line driving circuit 403 or locations between the pixel portion 402 and the scanning line driving circuits 404a and 404b.

This embodiment mode can be arbitrarily combined with Embodiment Modes 1 to 3.

Embodiment Mode 5

In this embodiment mode, the structures and operations of a signal line driving circuit and a scanning line driving circuit, which control pixels via signal lines and the like, will be described with reference to the FIG. 13, respectively.

Figure 13A:
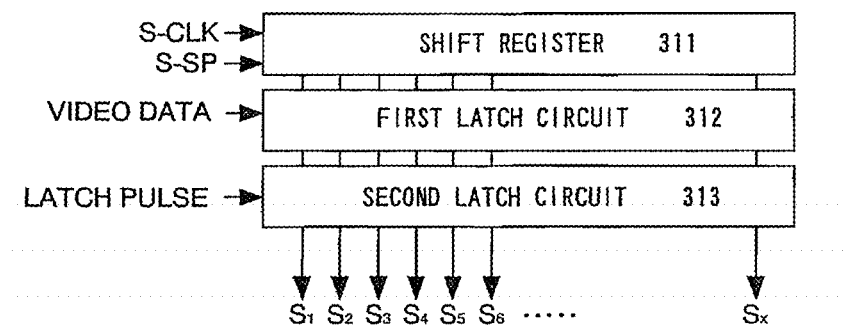
FIGS. 13A and 13B are diagrams of a signal line driving circuit and a scanning line driving circuit, respectively.

First, the signal line driving circuit is described with reference to the FIG. 13A. The signal line driving circuit has a shift register 311, a first latch circuit 312 and a second latch circuit 313. The shift register 311 comprises a plurality of flip-flop circuits (FF), and is supplied with a clock signal (S-CLK), a start pulse (S-SP), and a clock inversion signal (S-CLKb). Sampling pulses are output one by one according to the timing of these signals. The sampling pulse output from the shift register 311 is input into the first latch circuit 312. The first latch circuit 312 is supplied with digital video signals, which, in turn, are retained in each column according to the timing of the input of the sampling pulse.

In the first latch circuit 312, when the columns from the first to the last are filled with the retained video signals, a latch pulse is input into the second latch circuit 313 during the horizontal retrace line period. The video signals retained in the first latch circuit 312 are transferred to the second latch circuit 313, at the same time. Then, the one line of the video signals retained in the second latch circuit 313 is input into the signal lines $S_1$ to $S_x$, at the same time. While the video signals retained in the second latch circuit 313 are being input into the signal lines $S_1$ to $S_x$, sampling pulses are again output from the shift register 311. The above operation is repeated.

Figure 13B:
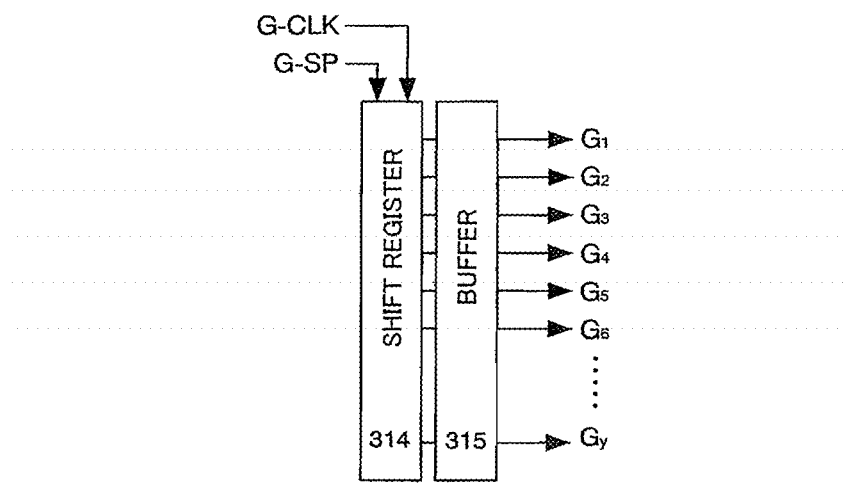

Next, the scanning line driving circuit is described with reference to the FIG. 13B. Each scanning line driving circuit has a shift register 314 and a buffer 315, respectively. Briefly, the shift register 314 outputs sampling pulses one by one according to the clock signal (G-CLK), a start pulse (G-SP) and a clock inversion signal (G-CLKb). Next, the sampling pulses amplified in the buffer 315 are input into the scanning line, and the scanning line is turned to be a selected state one by one in response to the input of the sampling pulse. The pixel controlled by the selected scanning line is supplied with digital video signals from signal lines $S_1$ to $S_x$ in sequence. A level shifter circuit may be provided between the shift register 314 and the buffer 315. By providing a level shifter circuit, the voltage amplitudes of the logic circuit portion and the buffer can be altered.

This embodiment mode can be implemented in conjunction with embodiment Mode 1, 2, 3 and/or 4.

Embodiment Mode 6

A driving method applied to a semiconductor device of the present invention is explained in brief in this embodiment mode.

Analog gray scale methods and digital gray scale methods can be given as rough classifications of driving methods for displaying multiple scale images, and both methods can be applied to the semiconductor device of the present invention. The difference between the two methods is in controlling the light-emitting elements when they are in a light-emitting state, and in a non-light-emitting state. The analog gray scale method is a method in which gray scales are obtained by controlling the amount of an electric current flowing in the light-emitting elements. Further, the digital gray scale method is a method of driving by using only two states, a state in which the light-emitting elements are on (a state in which the brightness is nearly 100%), and a state in which the light-emitting elements are off (a state in which the brightness is nearly 0%).

A method of combining the digital gray scale method with a surface area gray scale method (hereinafter written to as a surface area gray scale method) and a method of combining the digital gray scale method with a time gray scale method (hereinafter written as a time gray scale method) are proposed in order to express multiple gray scales image in the digital gray scale method.

The surface area gray scale method is a method in which one pixel is divided into a plurality of sub-pixels, and light emission or non-light emission is selected for each of the sub-pixels. Gray scales are expressed by the difference between the surface area over which light is emitted, and the remaining surface area, in the one pixel. Further, as reported in JP 2001-5426 A, the time gray scale method is a method in which gray scale expression is performed by controlling the amount of time during which the light-emitting elements emit light. Specifically, one frame period is divided into a plurality of subframe periods of different lengths, and selection is made in each period as to whether the light-emitting elements emit light or do not emit light. Gray scales are expressed by the difference in the lengths of time during which light is emitted within the one frame period.

The semiconductor device of the present invention can apply the analog gray scale method and the digital gray scale method. Further, single color display and multiple color display can be performed. Note that a plurality of sub-pixels corresponding to the colors R, G, and B are formed in one pixel when performing multiple color display. Even if the same voltage is applied to each of the sub-pixels, the brightness of light emitted will differ due to differences in such as transmittance of color filters or the electric current density of each of the R, G, and B materials. It is therefore preferable to change the electric potential of electric power source lines for each of the sub-pixels that correspond to each of the colors.

It is possible to arbitrarily combine this embodiment mode with Embodiment Modes 1 to 5.

Embodiment Mode 7

Electronic devices to which the present invention is applied may be given as a video camera, a digital camera, a goggles-type display (head mount display), a navigation system, a sound reproduction device (such as a car audio device and an audio set), a lap-top computer, a game machine, a portable information terminal (such as a mobile computer, a mobile telephone, a portable game machine, and an electronic book), an image reproduction device including a recording medium (more specifically, an device which can reproduce a recording medium such as a digital versatile disc (DVD) and so forth, and a display for displaying the reproduced image), or the like. Specific examples thereof are shown in FIGS. 14A to 14H.

Figure 14A:
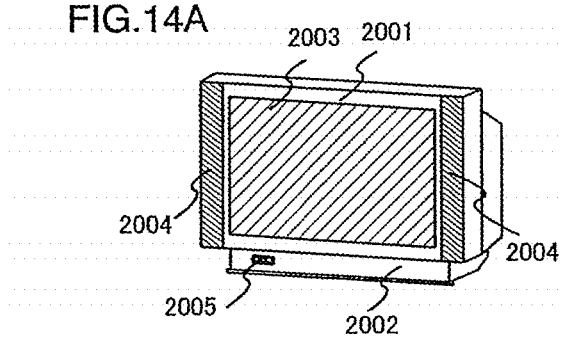
FIGS. 14A to 14H are diagrams of electronic devices to which the present invention is applied.

FIG. 14A illustrates a light-emitting device which includes a casing 2001, a support table 2002, a display portion 2003, a speaker portion 2004, a video input terminal 2005 and the like. The present invention is applicable to the display portion 2003. The light-emitting device is of the self-emission-type and therefore requires no backlight. Thus, the display portion thereof can have a thickness thinner than that of the liquid crystal display device. The light-emitting device is including the entire display device for displaying information, such as a personal computer, a receiver of TV broadcasting and an advertising display.

Figure 14B:
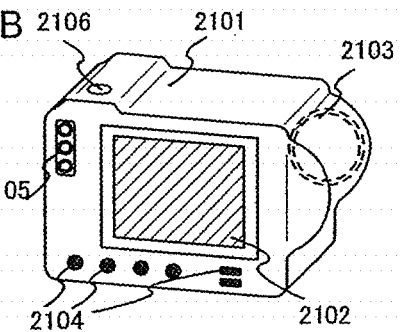

FIG. 14B illustrates a digital still camera which includes a main body 2101, a display portion 2102, an image receiving portion 2103, operation keys 2104, an external connection port 2105, a shutter 2106, and the like. The present invention can be applied to the display portion 2102.

Figure 14C:
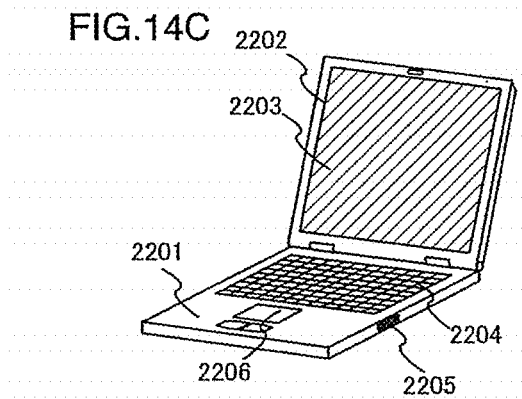

FIG. 14C illustrates a lap-top computer which includes a main body 2201, a casing 2202, a display portion 2203, a keyboard 2204, an external connection port 2205, a pointing mouse 2206, and the like. The present invention can be applied to the display portion 2203.

Figure 14D:
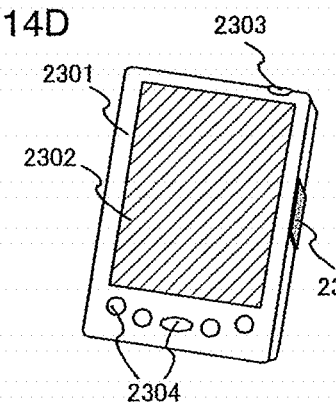

FIG. 14D illustrates a mobile computer which includes a main body 2301, a display portion 2302, a switch 2303, operation keys 2304, an infrared port 2305, and the like. The present invention can be applied to the display portion 2302.

Figure 14E:
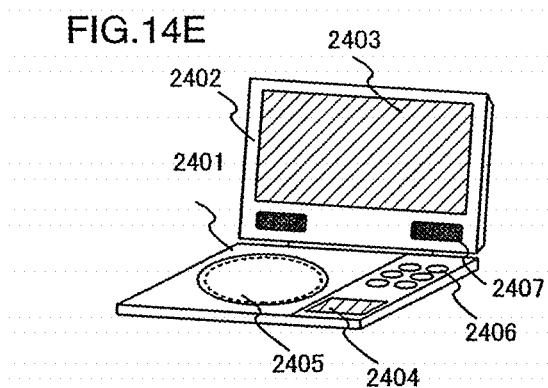

FIG. 14E illustrates a portable image reproduction device including a recording medium (more specifically, a DVD reproduction device), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. The present invention can be applied to these display portions A 2403 and B 2404. The image reproduction device including a recording medium further includes a game machine or the like.

Figure 14F:
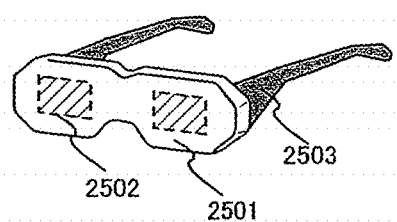

FIG. 14F illustrates a goggle type display (head mounted display) which includes a main body 2501, a display portion 2502, an arm portion 2503, and the like. The present invention can be applied to the display portion 2502.

Figure 14G:
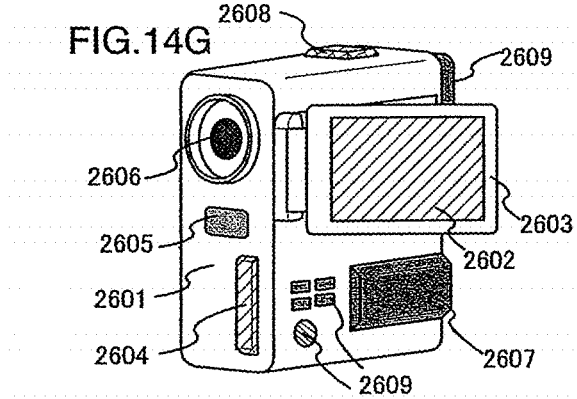

FIG. 14G illustrates a video camera which includes a main body 2601, a display portion 2602, a casing 2603, an external connecting port 2604, a remote control receiving portion 2605, an image receiving portion 2606, a battery 2607, a sound input portion 2608, operation keys 2609, and the like. The present invention can be applied to the display portion 2602.

Figure 14H:
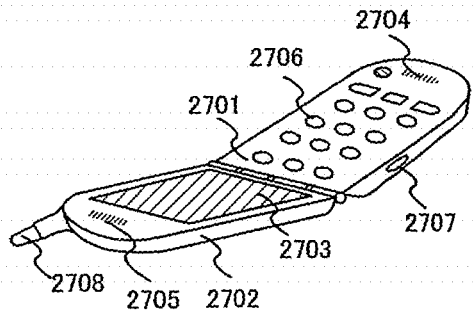
Figure 15:
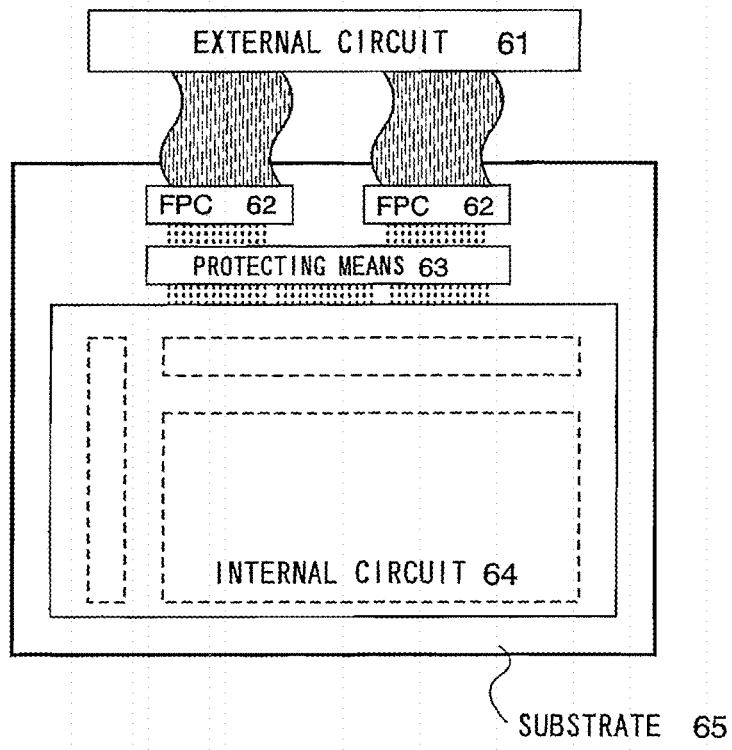
FIG. 15 is a diagram of a semiconductor device.

FIG. 14H illustrates a mobile telephone which includes a main body 2701, a casing 2702, a display portion 2703, a sound input portion 2704, a sound output portion 2705, operation keys 2706, an external connecting port 2707, an antenna 2708, and the like. The present invention can be applied to the display portion 2703. Note that the display portion 2703 can reduce power consumption of the mobile telephone by displaying white-colored characters on a black-colored background.

When a brighter luminance of light-emitting materials becomes available in the future, the light-emitting device of the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. Since the response speed of the light-emitting materials is very high, the light-emitting device is preferably used for moving picture display.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a mobile telephone or a sound reproduction device, it is desirable to drive the light-emitting device so that the character information is formed by a light-emitting portion while a non-emission portion corresponds to the background.

As set forth above, the present invention can be applied variously to a wide range of electronic devices in all fields. The electronic devices in this embodiment mode can be obtained by utilizing a light-emitting device having a structure in which the structures in Embodiment Modes 1 through 6 are arbitrarily combined.

Embodiment Mode 8

A module with a mounted IC that contains a controller, electric power source circuit, and the like is loaded in a panel in a state in which a light-emitting element is sealed in the electronic devices shown in Embodiment Mode 7. The module and the panel both correspond to embodiments of a display device. The specific structure of the module is explained here.

Figure 16A:
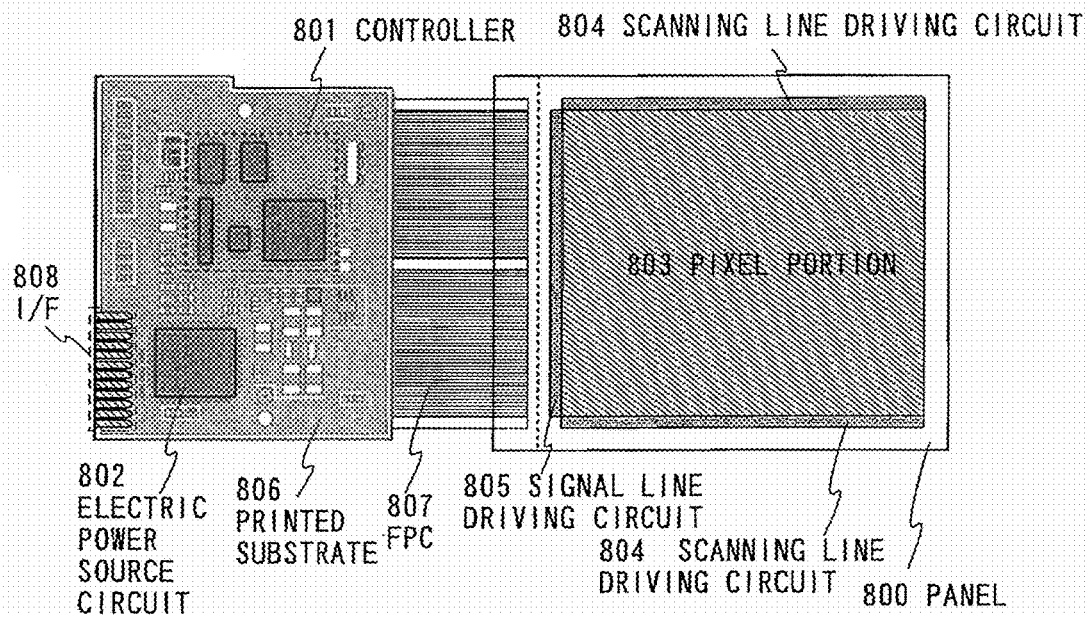
FIGS. 16A and 16B are diagrams showing a module.

A schematic diagram of the module in which a controller 801 and an electric power source circuit 802 are mounted into a panel 800 is shown in FIG. 16A. A pixel portion 803 in which a light-emitting element is formed in each pixel, a scanning line driving circuit 804 for selecting pixels in the pixel portion 803, and a signal line driving circuit for supplying a video signal to the selected pixels are formed in the panel 800. Further, the controller 801 and the electric power source circuit 802 are formed in a printed substrate 806. Each type of signal and an electric power source voltage output from the controller 801 or the electric power source circuit 802 is supplied through an FPC 807 to the pixel portion 803, the scanning line driving circuit 804, and the signal line driving circuit 805 of the panel 800. The electric power source voltage and each type of signal are supplied to the printed substrate 806 through an interface (I/F) portion 808 on which a plurality of input terminals are disposed.

Note that although the printed substrate 806 is mounted via an FPC to the panel 800 in this embodiment, the structure is not always necessarily limited to this. The controller 801 and the electric power source circuit 802 may also be mounted directly to the panel 800 by using a COG (chip on glass) method. Further, noise may ride on the electric power source voltage and the signals, and the signal rise time may become slowed, due to capacitances that are formed between leading wirings, resistance of wirings themselves, and the like in the printed circuit 806. Various types of elements, such as capacitors and buffers, may be formed in the printed substrate 806 so as to prevent noise from riding on the electric power source voltage or the signals, and slowness in the signal rise time.

Figure 16B:
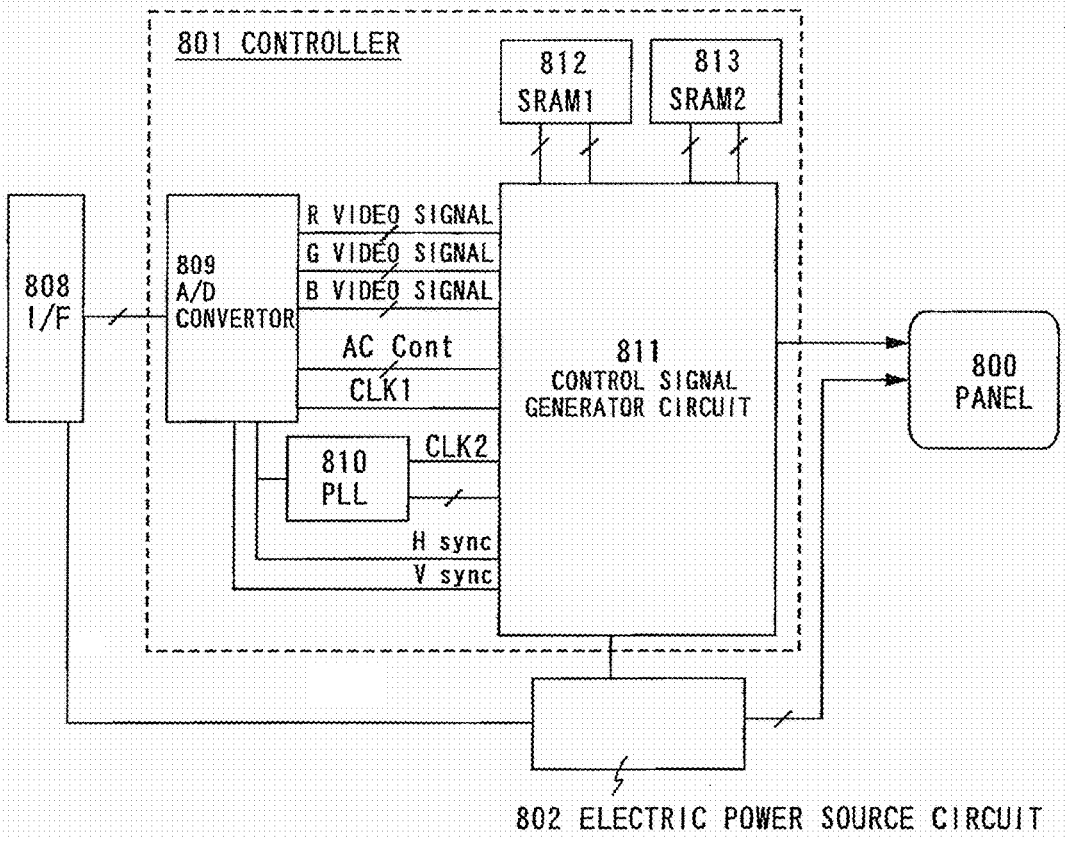

A block diagram of the structure of the printed substrate 806 is shown in FIG. 16B. Each of the signals and the electric power source voltage supplied by to the interface 808 is supplied to the controller 801 and the electric power source circuit 802. The controller 801 has an analog interface circuit 809, a phase locked loop (PLL) 810, a control signal generator circuit 811, and SRAMs (static random access memories) 812 and 813. Note that, although SRAMs are used here, it is also possible to use SDRAMs or DRAMs (dynamic random access memories) as substitutes for the SRAM, provided that the DRAMs are capable of writing and reading data at a high speed.

An analog video signal supplied through the interface 808 undergoes A/D conversion and parallel-serial conversion in the analog interface circuit 809, and is input to the control signal generator circuit 811 as a digital video signal corresponding to the colors R, G, and B. Further, an Hsync signal, a Vsync signal, a clock signal CLK, and the like are generated in the analog interface circuit 809 based on each of the signals supplied through the interface 808, and then input to the control signal generator circuit 811. The analog interface circuit 809 need not be disposed if a digital video signal is input directly into the interface 808.

The phase locked loop 810 functions to align the phase of the operating frequency of the control signal generator circuit 811 with the frequency of each of the signals supplied through the interface 808. The operating frequency of the control signal generator circuit 811 is not necessarily the same as the frequency of each of the signals supplied through the interface 808. The operating frequency of the control signal generator circuit 811 is regulated in the phase locked loop 810 so that the frequencies become synchronized.

The video signal input to the control signal generator circuit 811 is temporarily written into the SRAMs 812 and 813, and stored. A video signal corresponding to all pixels is read out one bit at a time from the video signals of all of the bits that are stored in the SRAM 812, and then supplied to the signal line driving circuit 805 of the panel 800. The control signal generator circuit 811 supplies information, which relates to light emission periods by the light-emitting elements for each bit, to the scanning line driving circuit 804 of the panel 800. The electric power source circuit 802 supplies a predetermined electric power source voltage to the signal line driving circuit 805, the scanning line driving circuit 804, and the pixel portion 803 of the panel 800.

The structure of the electric power source circuit 802 is explained next using FIG. 17. The electric power source circuit 802 includes a switching regulator 854 that uses four switching regulator controls 860, and a series regulator 855. Switching regulators are generally small in size and lightweight compared to series regulators, and it is possible to have a repeated voltage rises and positive-negative inversions without a drop in a voltage. On the other hand, series regulators are only used in voltage step-down, but have a good precision output voltage, and almost no ripple and no noise, compared to switching regulators. Both types are combined and used as the electric power source circuit 802 of this embodiment.

Figure 17:
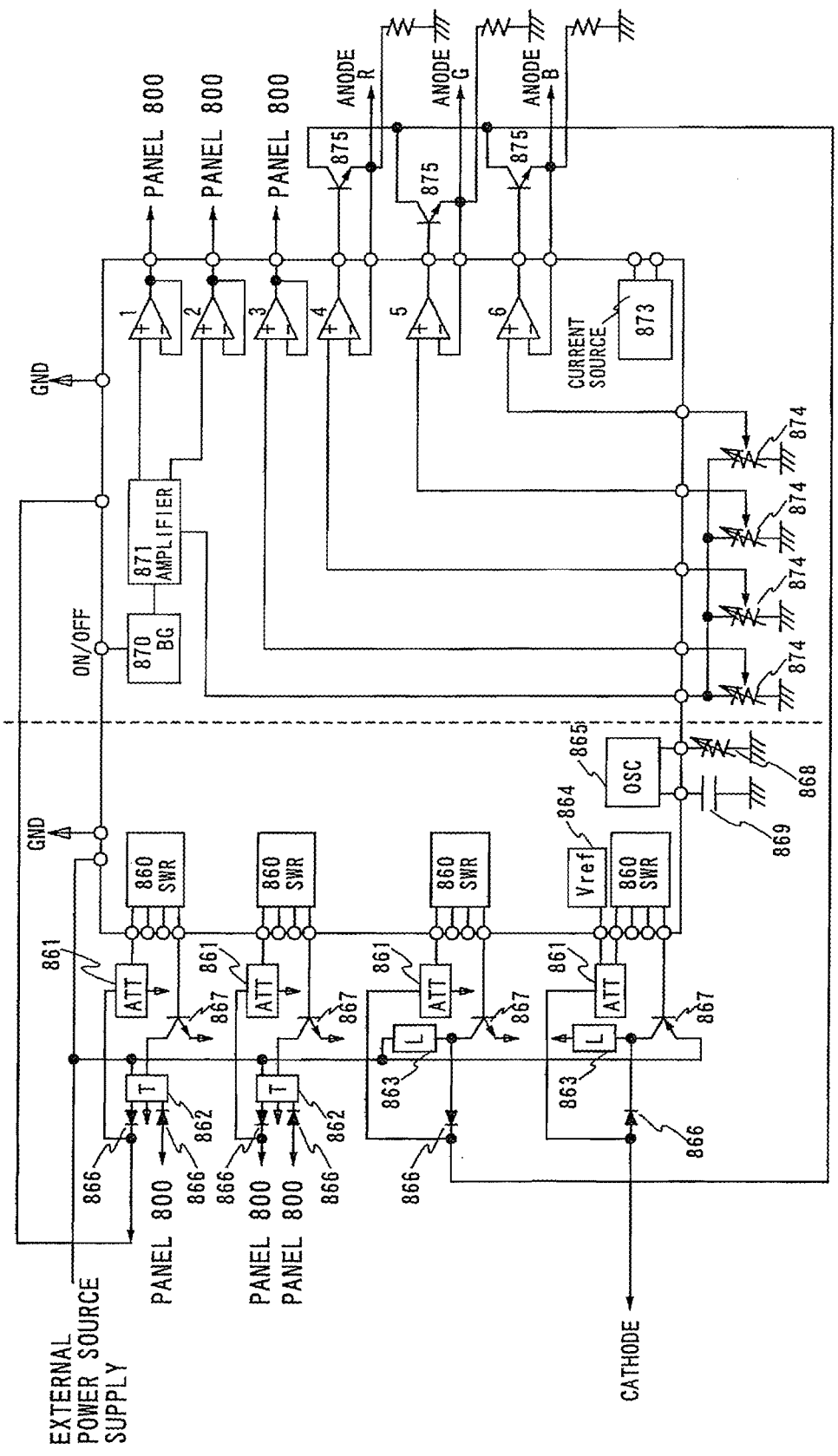
FIG. 17 is a diagram showing an electric power source circuit.

The switching regulator 854 shown in FIG. 17 has switching regulator controls (SWR) 860, attenuators (ATT) 861, transformers (T) 862, inductors (L) 863, a reference voltage source (Vref) 864, an oscillator circuit (OSC) 865, diodes 866, bipolar transistors 867, a variable resistance 868, and a capacitor 869. If a voltage from an external Li ion battery (3.6 V) or the like is converted in the switching regulator 854, an electric power source voltage imparted to a cathode, and an electric power source voltage supplied to the switching regulator 854 are generated.

The series regulator 855 has a band gap circuit (BG) 870, an amplifier 871, op amps 1 to 6, a current source 873, variable resistances 874, and bipolar transistors 875. The electric power source voltages generated in the switching regulator 854 are supplied. DC electric power source voltages imparted to wirings (electric current supply lines) in order to supply a current to anodes of each color of the light-emitting elements are generated by the series regulator 855, using the electric power source voltages generated in the switching regulator 854, based on a fixed voltage generated in the band gap circuit 870.

Note that the current source 873 is used for cases of a driving method in which a video signal current is written into the pixels. In this case, the current generated in the current source 873 is supplied to the signal line driving circuit 805 of the panel 800. Note that it is not always necessary to form the current source 873 for driving methods in which a video signal voltage is written into the pixels.

Figure 18:
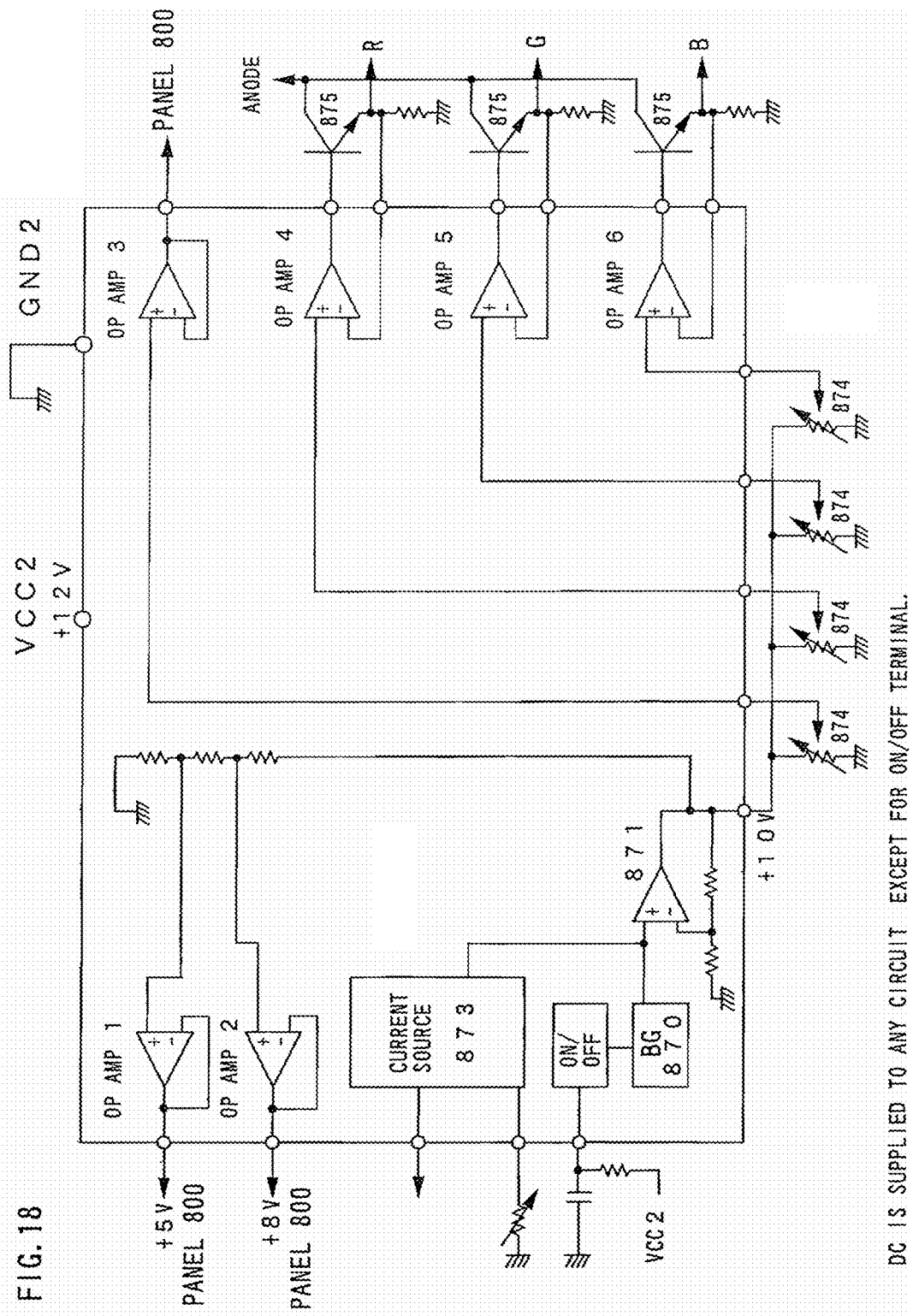
FIG. 18 is a diagram showing a series regulator.

Operation in the series regulator 855, which is a structural element of the electric power source circuit 802, is explained next in brief using FIG. 18. A reference voltage is generated by the band gap circuit 870, and the reference voltage is amplified by the amplifier 871. A 10 V electric power source is made here. Further, the voltage generated by the band gap circuit 870 is also used in the current source 873.

Note that the band gap circuit 870 is controlled by an external on/off terminal. The external on/off terminal is disposed because there are times when the voltage supplied from the switching regulator 854 is not stable, mainly during electric power source start up and the like. If used as it is, it is difficult to obtain a desired signal from the band gap circuit 870. A delay is provided by the on/off terminal, suppressing this phenomenon.

The op amp 1 supplies a voltage of +5V supplied by dividing a voltage of +10V supplied from the amplifier 871 using an internal resistance, and functions as a buffer. The op amp 2 supplies a voltage of +8V supplied by converting the voltage of +10V supplied from the amplifier 871 using an internal resistance, and functions as a buffer. The op amp 3 supplies a voltage supplied by dividing the voltage of +10V from the amplifier 871 using an external variable resistance, and functions as a buffer. The op amps 4-6 supply a voltage supplied by dividing the voltage of +10V supplied from the amplifier 871 using an external variable resistance, and functions as a buffer. Note that the op amps 4 to 6 use transistors 875 in final output stages because a large amount of an output current is necessary. The current source 873 converts the reference voltage generated by the band gap circuit 870 to a current by using an external resistance, performs inversion by an internal current mirror, and outputs the inverted current. The current source 873 is necessary in order to make temperature changes small because there are times cases when the amount of a current supplied varies due to temperature changes. The series regulator 855 forms six DC voltage sources by using a +12 V voltage source that is structured by the switching regulator 854.

Figure 19:
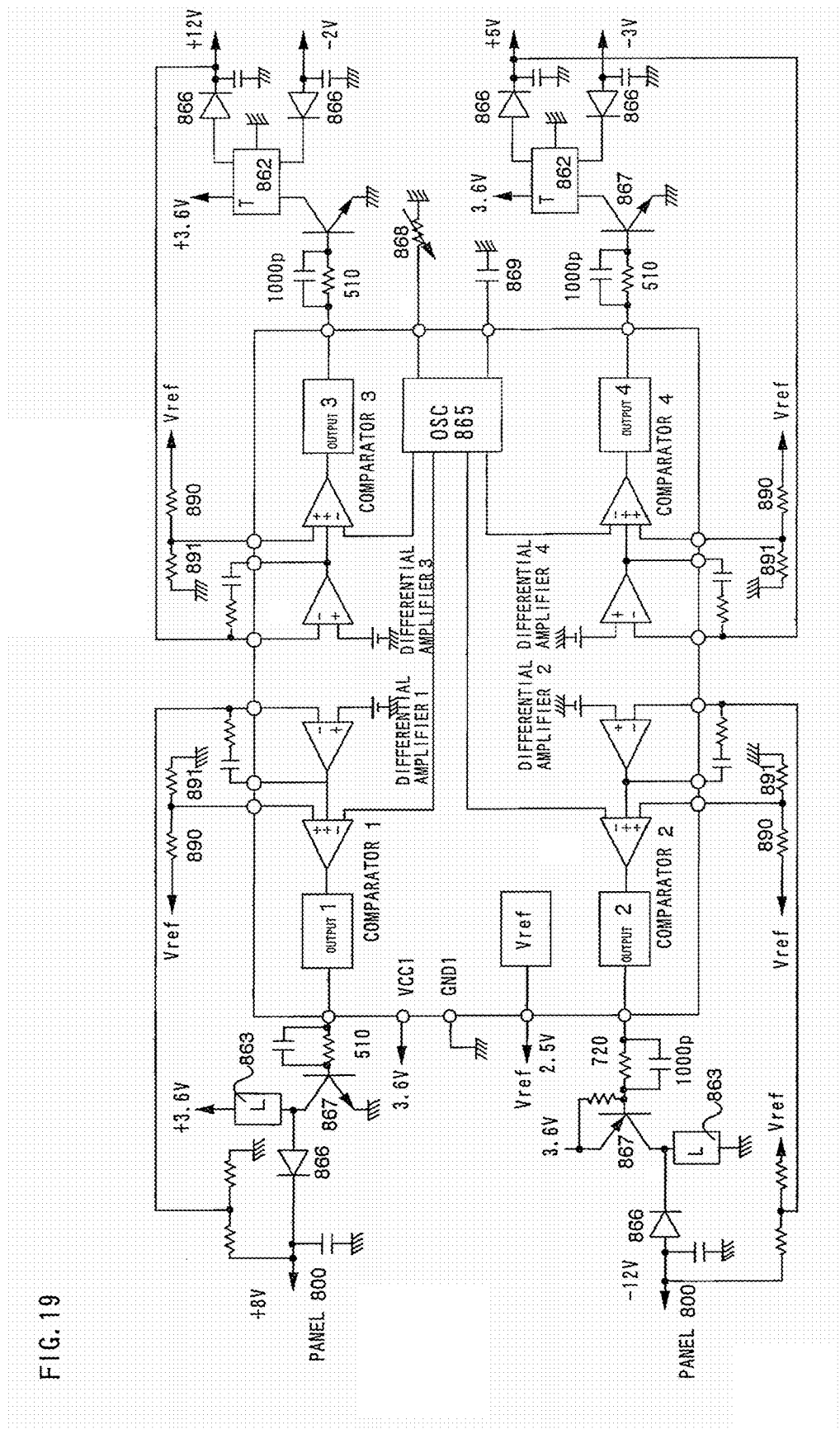
FIG. 19 is a diagram showing a switching regulator.

The structure and operation in the switching regulator 854, which is a structural element of the electric power source circuit 802, is explained next in brief using FIG. 19. The switching regulator controls (SWR) 860 are structured by differential amplifiers 1 to 4, comparators 1 to 4, and output circuits 1 to 4. The ATTs 861 are structured from resistances 890 and 891. The differential amplifiers 1 to 4 detect the output voltage of the switching regulator. The voltage gain is fixed for the differential amplifiers 1 to 4, and phase compensation stabilized with respect to the system can be achieved. The controllers 1 to 4 are voltage comparators that possess one inverted input and two non-inverted inputs, and are voltage-pulse width converters that control output pulse on time corresponding to the input voltage. Structural elements of the switching regulator 854 other than those described above have already been discussed, and are therefore omitted here.

The transistor 867 is always operated in an on mode or an off mode in the switching regulator 854. The DC output voltage can be stabilized by changing the ratio of time in this mode. Voltage losses in the transistor 867 are therefore small, and an electric power source having a good voltage conversion efficiency results. However, the on/off switching frequency is a high frequency, and therefore the transformer 862 can be made small. The switching regulator 854 here structures six DC electric power sources, in which a voltage of +3.6 V is input and then stepped up. The output voltages become +12 V, −2 V, +8 V, −12 V, +5 V, and −3 V. Among these, +12 V and −2 V are generated from the same circuit, and +S V and −3 V are generated from the same circuit.

Figure 20:
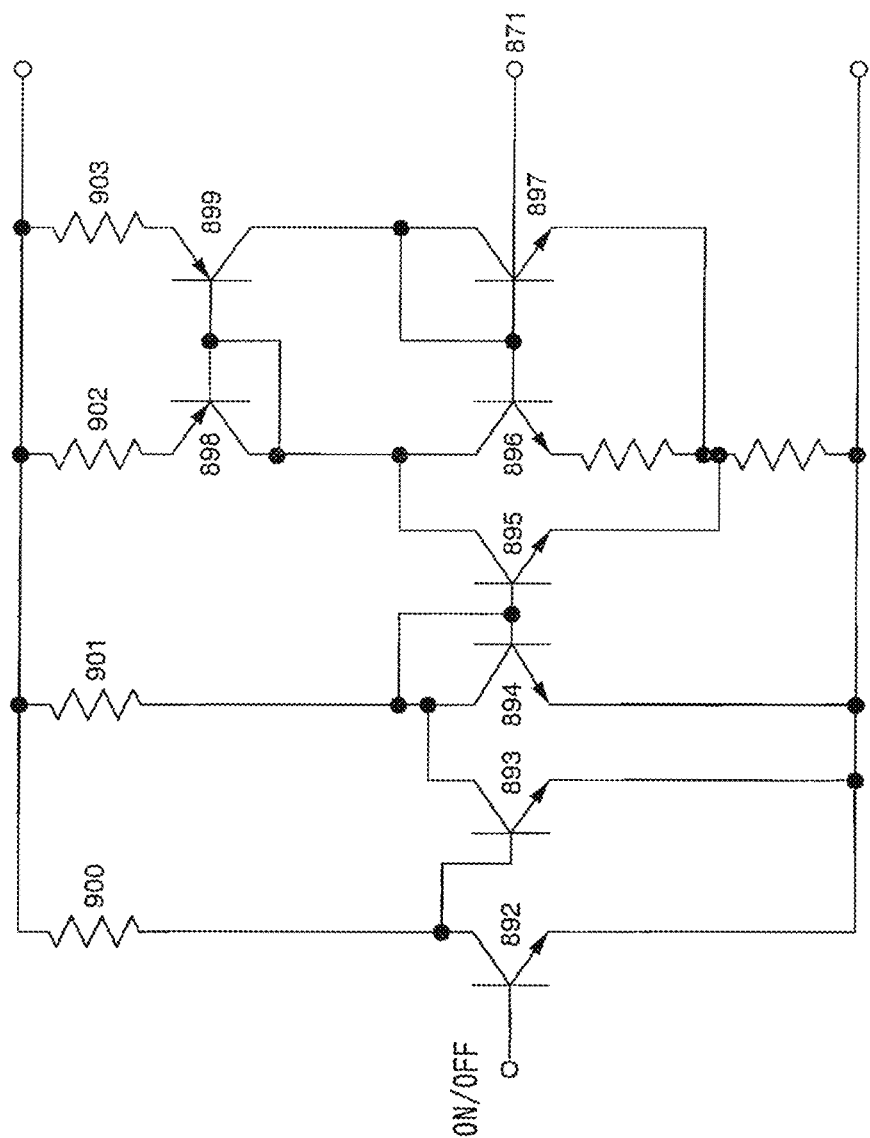
FIG. 20 is a diagram showing a band gap circuit.

The structures of the on/off terminal and the band gap circuit 870 are explained next using FIG. 20. The band gap circuit 870 is structured by transistors 892 to 899, and resistors 900 to 903. An output terminal is connected to the amplifier 871. The band gap circuit 870 having the structure of FIG. 20 functions to generate a reference voltage.

Figure 21:
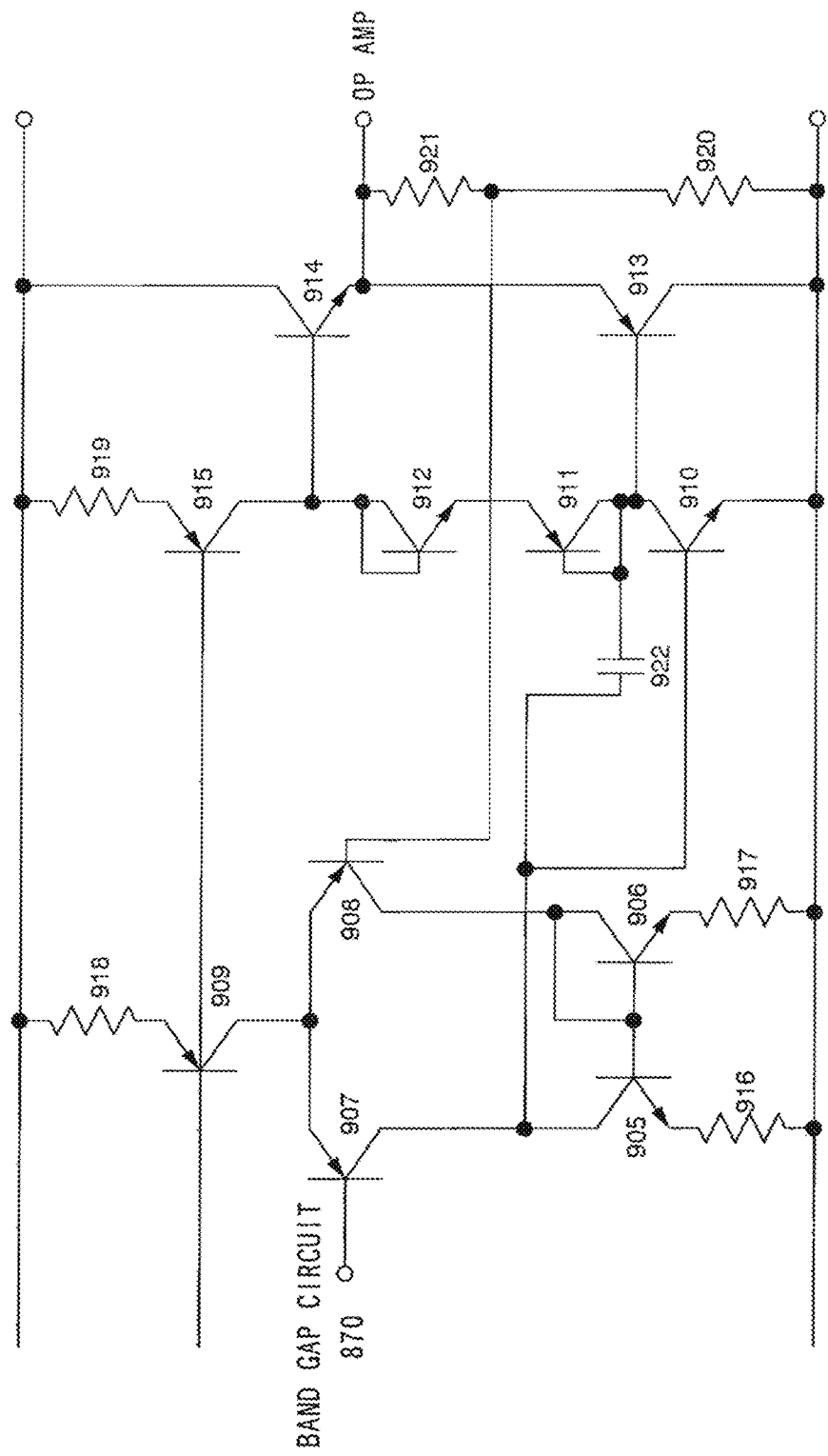
FIG. 21 is a diagram showing a DC amplifier.

The structure of the amplifier (DC amplifier) 871, which is a structural element of the series regulator 855, is explained next using FIG. 21. The amplifier 871 has transistors 905 to 915, resistors 916 to 920, and a capacitor 922. Signals are supplied to an input terminal from the band gap circuit 870. Signals output from an output terminal are supplied to the op amps 1 to 6.

Figure 22:
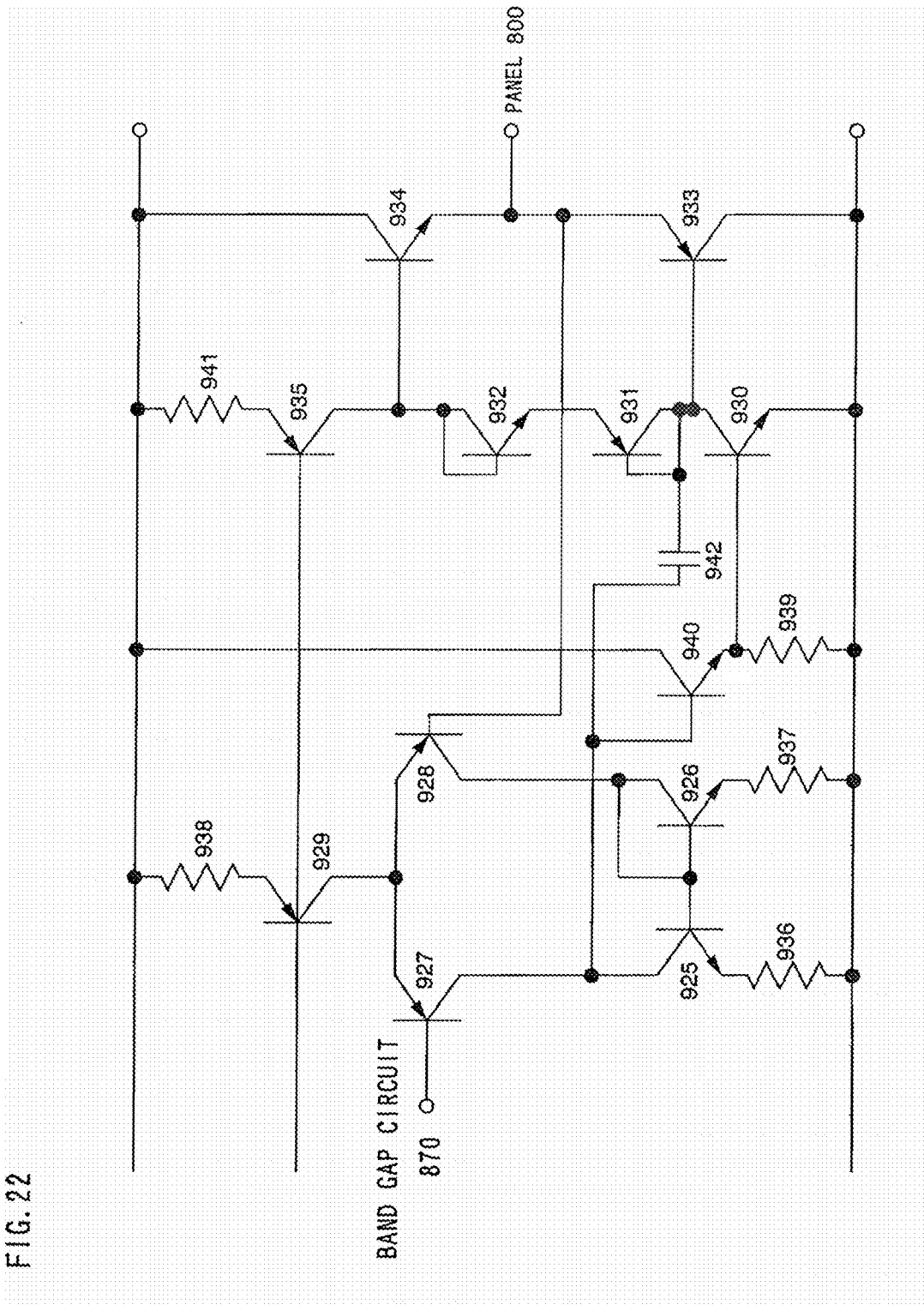
FIG. 22 is a diagram showing an operational amplifier.

The structure of the op amps 1 to 3 is explained using FIG. 22. The op amps 1 to 3 have transistors 925 to 935 and 940, resistors 936 to 939 and 941, and a capacitor element 942. Signals from the band gap circuit 870 are supplied to an input terminal. Signals output from an output terminal are supplied to the panel 800.

Figure 23:
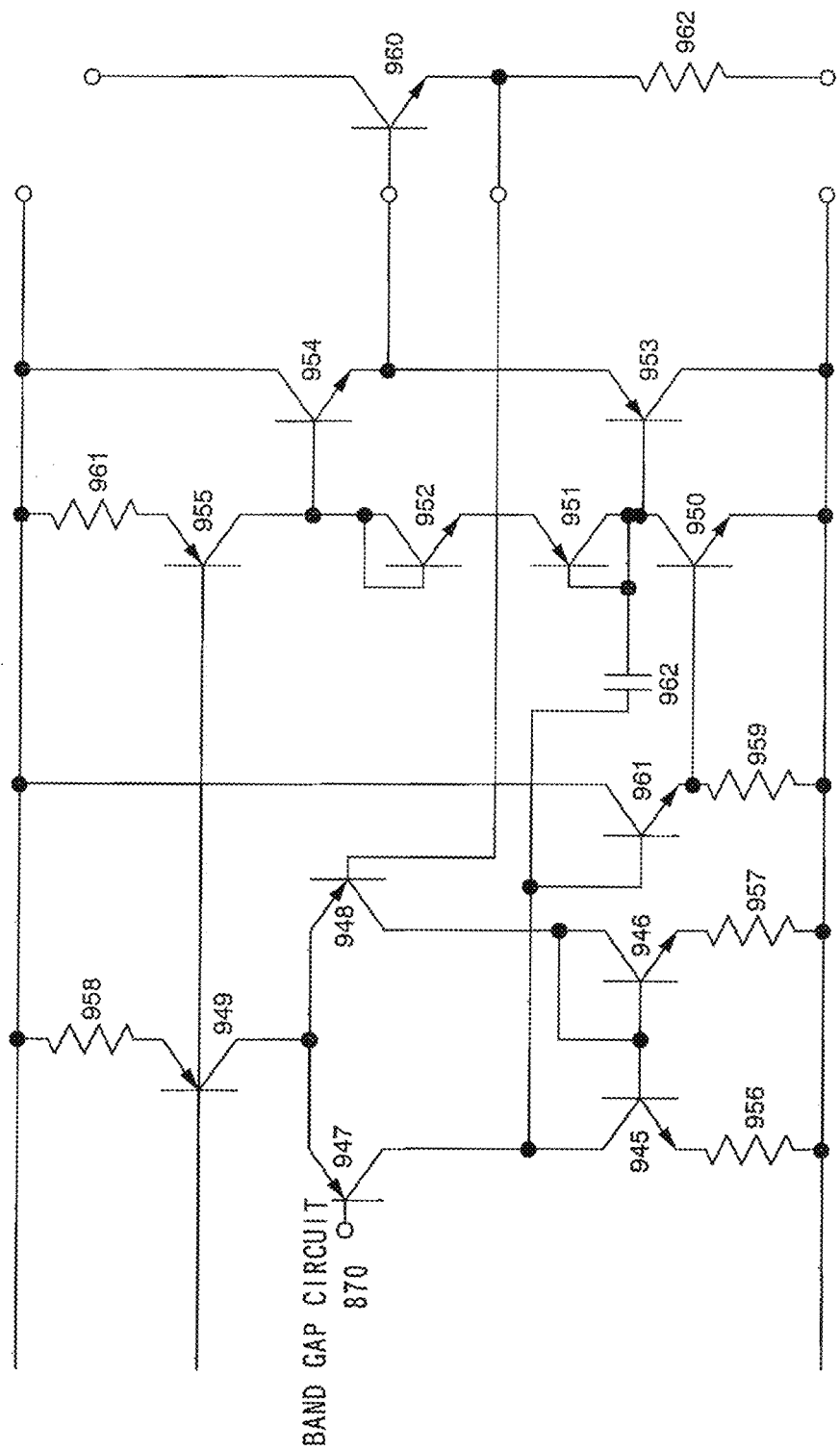
FIG. 23 is a diagram showing an operational amplifier.

The structure of the op amps 4 to 6 is explained using FIG. 23. The op amps 4 to 6 have transistors 945 to 955 and 960, resistors 956 to 959, 961, and 962, and a capacitor element 962. Signals from the band gap circuit 870 are supplied to an input terminal. Signals output from an output terminal are imparted to a wiring (current supply line) in order to supply a current to the anode of each color of the light-emitting elements.

Figure 24:
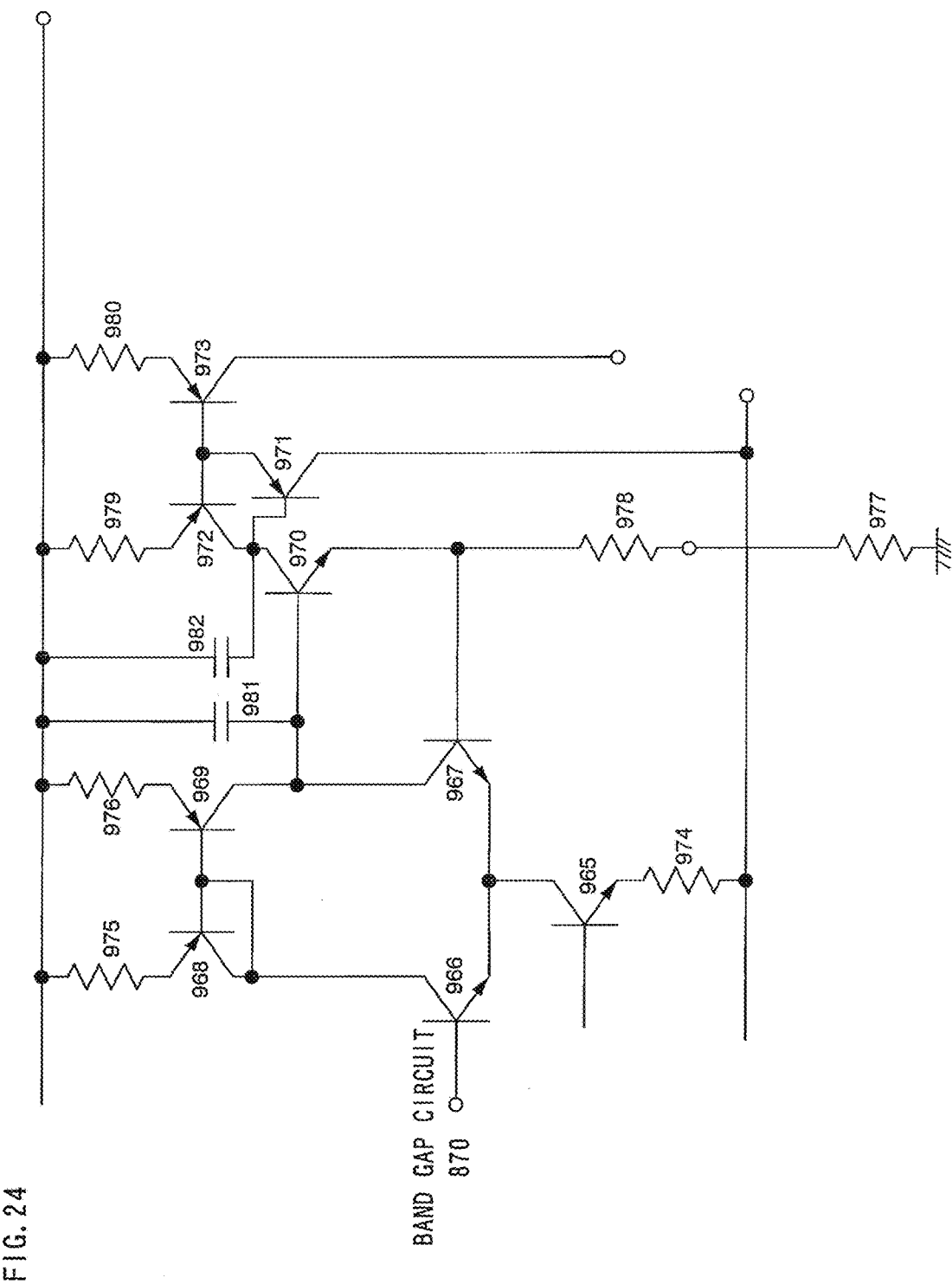
FIG. 24 is a diagram showing an electric current source.

The structure of the current source 873 is explained using FIG. 24. The current source 873 has transistors 965 to 973, resistors 974 to 980, and capacitor elements 981 and 982. Signals from the band gap circuit 870 are supplied to an input terminal.

The controller 801 and the electric power source circuit 802 having the structure described above are mounted to the panel 800, thus completing a module, which is an embodiment mode of the present invention.

The present invention disposes a resistor element between a pixel electrode and a transistor, so that excess electric charge that builds up in the pixel electrode is not supplied all at once and directly to the transistor. Sudden changes in the electric potential of a source electrode or a drain electrode of the transistor are thus relieved. Further, a capacitor element is disposed between the pixel electrode and the transistor, so that the excess charge that builds up in the pixel electrode is distributed to the capacitor element and the transistor. Sudden changes in the electric potential of the source electrode or the drain electrode of the transistor are thus relieved.

Further, a diode is disposed between the pixel electrode and the transistor so that the excess charge that builds up in the pixel electrode is discharged to an electric power source line. Sudden changes in the electric potential of the source electrode or the drain electrode of the transistor are thus relieved. The present invention thus prevents electrostatic discharge damage by relieving sudden changes in the electric potential of the source electrode or the drain electrode of the transistor caused by the electric charge that builds up in the pixel electrode. Further, the present invention prevents electrostatic discharge damage during manufacturing processes, and in particular, electrostatic discharge damage in a state up through the manufacture of the pixel electrode.

What is claimed is:

1. A pixel circuit implementing a circuit diagram comprising:
   a semiconductor layer, a first transistor, a second transistor and a capacitor element,
   wherein the first transistor includes:
      a first part of the semiconductor layer; and
      a gate electrode,
   wherein the first part of the semiconductor layer includes a curved region in a top view of the pixel circuit,
   wherein an entire part of the curved region and at least a part of the gate electrode of the first transistor overlap each other,
   wherein, in the circuit diagram, the gate electrode of the first transistor is directly connected to a first terminal of the second transistor,
   wherein, in the circuit diagram, a first terminal of the capacitor element is directly connected to the gate electrode of the first transistor, and
   wherein the first terminal of the capacitor element is a second part of the semiconductor layer.

2. The pixel circuit implementing the circuit diagram according to claim 1, further comprising:
   a third transistor, a first line, a second line, a third line, and a light-emitting element,
   wherein the first transistor includes an insulating layer over the semiconductor layer,
   wherein, in the circuit diagram, a first terminal of the first transistor is electrically connected to the first line,
   wherein, in the circuit diagram, a second terminal of the first transistor is electrically connected to the light-emitting element,
   wherein, in the circuit diagram, the gate electrode of the first transistor is directly connected to a first terminal of the third transistor,
   wherein, in the circuit diagram, a gate electrode of the second transistor is directly connected to the second line, and
   wherein, in the circuit diagram, a gate electrode of the third transistor is directly connected to the third line.

3. The pixel circuit implementing the circuit diagram according to claim 2, further comprising a fourth line, wherein, in the circuit diagram, a second terminal of the second transistor is electrically connected to the fourth line.

4. The pixel circuit implementing the circuit diagram according to claim 2, wherein, in the circuit diagram, a second terminal of the third transistor is electrically connected to the first line.

5. The pixel circuit implementing the circuit diagram according to claim 2,
   wherein, in the circuit diagram, the first terminal of the first transistor is directly connected to the first line, and
   wherein, in the circuit diagram, the second terminal of the first transistor is directly connected to the light-emitting element.

6. The pixel circuit implementing the circuit diagram according to claim 2, further comprising a resistor,
   wherein, in the circuit diagram, a first terminal of the resistor is electrically connected to the second terminal of the first transistor, and
   wherein, in the circuit diagram, a second terminal of the resistor is electrically connected to the light-emitting element.

7. The pixel circuit implementing the circuit diagram according to claim 1, wherein the semiconductor layer comprises polysilicon.

8. A module comprising a flexible print circuit and the pixel circuit implementing the circuit diagram according to claim 1.

9. An electronic device comprising:
   the module according to claim 8; and
   at least one of an antenna, a speaker, and a battery.

10. A pixel circuit implementing a circuit diagram comprising:
    a semiconductor layer, a first transistor, a second transistor and a capacitor element,
    wherein the first transistor includes:
       a first part of the semiconductor layer; and
       a gate electrode,
    wherein the first part of the semiconductor layer includes a curved region in a top view of the pixel circuit,
    wherein an entire part of the curved region and at least a part of the gate electrode of the first transistor overlap each other,
    wherein a channel length of the first transistor is larger than a channel length of the second transistor,
    wherein, in the circuit diagram, the gate electrode of the first transistor is directly connected to a first terminal of the second transistor,
    wherein, in the circuit diagram, a first terminal of the capacitor element is directly connected to the gate electrode of the first transistor,
    wherein the first terminal of the capacitor element is a second part of the semiconductor layer,
    wherein each of the first transistor, the second transistor and the capacitor element is over a laminate film including a first layer and a second layer,
    wherein the first layer includes nitrogen and silicon, and
    wherein the second layer includes oxygen and silicon.

11. The pixel circuit implementing the circuit diagram according to claim 10, further comprising:
    a third transistor, a first line, a second line, a third line, and a light-emitting element,
    wherein the first transistor includes an insulating layer over the semiconductor layer, wherein, in the circuit diagram, a first terminal of the first transistor is electrically connected to the first line, wherein, in the circuit diagram, a second terminal of the first transistor is electrically connected to the light-emitting element, wherein, in the circuit diagram, the gate electrode of the first transistor is directly connected to a first terminal of the third transistor, wherein, in the circuit diagram, a gate electrode of the second transistor is directly connected to the second line, wherein, in the circuit diagram, a gate electrode of the third transistor is directly connected to the third line, and wherein the first line is a power supply line.

12. The pixel circuit implementing the circuit diagram according to claim 11, further comprising a fourth line, wherein, in the circuit diagram, a second terminal of the second transistor is electrically connected to the fourth line.

13. The pixel circuit implementing the circuit diagram according to claim 11, wherein, in the circuit diagram, a second terminal of the third transistor is electrically connected to the first line.

14. The pixel circuit implementing the circuit diagram according to claim 11, wherein, in the circuit diagram, the first terminal of the first transistor is directly connected to the first line, and wherein, in the circuit diagram, the second terminal of the first transistor is directly connected to the light-emitting element.

15. The pixel circuit implementing the circuit diagram according to claim 11, further comprising a resistor, wherein, in the circuit diagram, a first terminal of the resistor is electrically connected to the second terminal of the first transistor, and wherein, in the circuit diagram, a second terminal of the resistor is electrically connected to the light-emitting element.

16. The pixel circuit implementing the circuit diagram according to claim 11, wherein, in the circuit diagram, a second terminal of the capacitor element is directly connected to the light-emitting element.

17. The pixel circuit implementing the circuit diagram according to claim 10, wherein the semiconductor layer comprises polysilicon.

18. A module comprising a flexible print circuit and the pixel circuit implementing the circuit diagram according to claim 10.

19. An electronic device comprising:
the module according to claim 18; and
at least one of an antenna, a speaker, and a battery.

20. The pixel circuit implementing the circuit diagram according to claim 10, wherein the first layer is a silicon nitride oxide layer, and wherein the second layer is a silicon oxynitride layer.

* * * * *